US00RE51136E

(19) United States
(12) Reissued Patent
Kuech et al.

(10) Patent Number: US RE51,136 E
(45) Date of Reissued Patent: *Nov. 24, 2026

(54) AUDIO ENCODER DEVICE AND AN AUDIO DECODER DEVICE HAVING EFFICIENT GAIN CODING IN DYNAMIC RANGE CONTROL

(71) Applicant: Fraunhofer-Gesellschaft zur Foerderung der angewandten Forschung e.V., Munich (DE)

(72) Inventors: Fabian Kuech, Erlangen (DE); Christian Uhle, Ursensollen (DE); Michael Kratschmer, Fuerth (DE); Bernhard Neugebauer, Buckenhof (DE); Michael Meier, Aurachtal (DE); Stephan Schreiner, Birgland (DE)

(73) Assignee: Fraunhofer-Gesellschaft zur Foerderung der angewandten Forschung e.V., Munich (DE)

( * ) Notice: This patent is subject to a terminal disclaimer.

(21) Appl. No.: 18/783,216

(22) Filed: Jul. 24, 2024

Related U.S. Patent Documents

Reissue of:
(64) Patent No.: Re. 49,107
Issued: Jun. 14, 2022
Appl. No.: 16/404,503
Filed: May 6, 2019

Which is a Reissue of:
(64) Patent No.: 10,074,377
Issued: Sep. 11, 2018
Appl. No.: 15/272,653
Filed: Sep. 22, 2016

U.S. Applications:
(63) Continuation of application No. PCT/EP2015/055945, filed on Mar. 20, 2015.

(30) Foreign Application Priority Data

Mar. 25, 2014 (EP) ..... 14161605

(51) Int. Cl.
*G10L 19/022* (2013.01)
*G10L 19/16* (2013.01)
*H03G 7/00* (2006.01)

(52) U.S. Cl.
CPC ..... *G10L 19/167* (2013.01); *G10L 19/022* (2013.01); *H03G 7/007* (2013.01)

(58) Field of Classification Search
CPC ..... G10L 19/022; G10L 19/167; H03G 7/007
See application file for complete search history.

(56) References Cited

U.S. PATENT DOCUMENTS 5,701,390 A 12/1997 Griffin et al.
6,785,655 B1 8/2004 Huang et al.
(Continued)

FOREIGN PATENT DOCUMENTS

CN 101587711 A 11/2009
EP 1588498 B1 6/2013
(Continued)

OTHER PUBLICATIONS

Information technology—Generic coding of moving pictures and associated audio information—Part 7: Advanced Audio Coding (AAC), ISO/IEC 13818-7:2004(E), Third edition, Oct. 15, 2004, 206 pp.

(Continued)

*Primary Examiner* — Rachna S Desai
(74) *Attorney, Agent, or Firm* — PERKINS COIE LLP; Michael A. Glenn

(57) ABSTRACT

An audio encoder device includes an audio encoder configured for producing an encoded audio bitstream from an audio signal having consecutive audio frames; a dynamic range control encoder configured for producing an encoded dynamic range control bitstream from [an] *a* dynamic range control sequence corresponding to the audio signal and having consecutive dynamic range control frames, wherein (Continued)

each dynamic range control frame of the dynamic range control frames has one or more nodes, wherein each node of the one or more nodes has gain information for the audio signal and time information indicating to which point in time the gain information corresponds.

53 Claims, 9 Drawing Sheets

(56) References Cited

U.S. PATENT DOCUMENTS

| | | | | |
|---|---|---|---|---|
| 8,588,307 | B2 * | 11/2013 | Park | H04N 19/174 375/240.16 |
| 8,718,797 | B1 * | 5/2014 | Addepalli | H04W 8/06 700/83 |
| 9,191,581 | B2 * | 11/2015 | Srinivasan | H04N 5/265 |
| 9,607,624 | B2 * | 3/2017 | Baumgarte | G10L 19/167 |
| 10,074,377 | B2 | 9/2018 | Kuech et al. | |
| 10,237,555 | B2 * | 3/2019 | Dong | H04N 19/625 |
| 2005/0228651 | A1 | 10/2005 | Wang et al. | |
| 2006/0235679 | A1 | 10/2006 | Sperschneider et al. | |
| 2010/0083344 | A1 | 4/2010 | Schildbach et al. | |
| 2010/0161322 | A1 | 6/2010 | Sung et al. | |
| 2011/0009987 | A1 * | 1/2011 | Seefeldt | H03G 9/005 700/94 |
| 2011/0208528 | A1 | 8/2011 | Schildbach et al. | |
| 2011/0257980 | A1 * | 10/2011 | Gao | G10L 21/038 704/500 |
| 2012/0310654 | A1 | 12/2012 | Riedmiller et al. | |
| 2013/0030800 | A1 | 1/2013 | Tracey et al. | |
| 2013/0144631 | A1 | 6/2013 | Miyasaka et al. | |
| 2013/0339037 | A1 | 12/2013 | Liljeryd et al. | |
| 2014/0019146 | A1 * | 1/2014 | Neuendorf | G10L 19/00 704/500 |
| 2014/0369527 | A1 * | 12/2014 | Baldwin | H03G 3/20 381/107 |
| 2015/0172661 | A1 * | 6/2015 | Dong | H04N 19/126 375/240.03 |
| 2015/0356978 | A1 * | 12/2015 | Dickins | G10L 19/0208 704/226 |
| 2016/0307580 | A1 * | 10/2016 | Riedmiller | G10L 19/26 |
| 2017/0011749 | A1 | 1/2017 | Kuech et al. | |
| 2017/0229134 | A1 * | 8/2017 | Baumgarte | H03G 7/002 |

FOREIGN PATENT DOCUMENTS

| | | | |
|---|---|---|---|
| JP | 2002271207 | A | 9/2002 |
| JP | 2012504260 | A | 2/2012 |
| RU | 2144222 | C1 | 1/2000 |
| TW | 293118 | B | 12/1996 |
| WO | 2012026092 | A1 | 3/2012 |
| WO | 2013173080 | A1 | 11/2013 |
| WO | 2013181115 | A1 | 12/2013 |
| WO | 2015144587 | A1 | 10/2015 |

OTHER PUBLICATIONS

ISO/IEC 14496-3, "Information technology—Coding of audio-visual objects, Part 3 Audio", Proof Reference No. ISO/IEC 14496-3:2009(E), Fourth Edition, 2009, 1416 pp.

ISO/IEC 23003-3, "Information Technology—MPEG audio technologies—Part 3: Unified Speech and Audio Coding", International Standard, ISO/IEC FDIS 23003-3, Nov. 23, 2011, 286 pp.

ISO/IEC, "Information technology—Generic coding of moving pictures and associated audio information—Part 7: Advanced Audio Coding (AAC)", ISO/IEC 13818-7:2004(E), Third edition, Oct. 15, 2004, 206 pages.

Baumgarte, Frank et al., "Description of Apple's Proposal Considering the CfP on Dynamic Range Control Technology", 106 MPEG Meeting Oct. 28, 2013-Nov. 1, 2013, Geneva, Oct. 2013, 32 pages.

ISO/IEC 14496-3, "Information technology—Coding of audio-visual objects, Part 3 Audio", Proof Reference No. ISO/IEC 14496-3:2009(E), Fourth edition, 2009, 1416 pages.

"ATSC Recommended Practice: Techniques for Establishing and Maintaining Audio Loudness for Digital Television A/85 Revision History", Advanced Television Systems Committee. Retrieved from the Internet: http://www.atsc.org/cms/standards/a_85-2011a.pdf, Jul. 25, 2011, pp. 54-57.

Baumgarte et al., "Enhanced Metadata for Dynamic Range Compression", 104. MPEG Meeting; Apr. 22, 2013-Apr. 26, 2013; Incheon; (Motion Picture Expert Group or ISO/IEC JTC1/SC29/WG11 MPEG2013/M28091), Apr. 17, 2013, 10 pages.

Baumgarte et al., "A Dynanic Range Compression Tool for Audio", 106 MPEG Meeting Oct. 28, 2013-Nov. 1, 2013, Geneva, ISO/IEC JTC1/SC29/WG11 MPEC2013/M31471, Oct. 2013, 32 pages.

Giannoulis et al., "Digital Dynamic Range Compressor Design—A Tutorial and Analysis", J. Audio Engineering Society, vol. 60, No. 6,, Jun. 2012, pp. 399-408.

ISO/IEC 23003-3, "Information Technology—MPEG audio technologies—Part 3: Unified Speech and Audio Coding", International Standard, ISO/IEC FDIS 23003-3, Nov. 23, 2011, 286 pages.

ISO/IEC 14496-3, "Information technology—Coding of audio-visual objects, Part 3 Audio", International Standard, Forth edition, 2009, 1416 Pages.

"ATSC Standard: Digital Audio Compression (AC-3, E-AC-3)", Advanced Television Systems Committee. Doc.A/52:2012, Dec. 17, 2012, pp. 1-270.

* cited by examiner

AUDIO ENCODER DEVICE AND AN AUDIO DECODER DEVICE HAVING EFFICIENT GAIN CODING IN DYNAMIC RANGE CONTROL

Matter enclosed in heavy brackets [ ] appears in the original patent but forms no part of the first and this reissue specification; matter printed in italics indicates the additions made by the first reissue. Matter enclosed in double heavy brackets [[ ]] appears in the first reissue patent but forms no part of this reissue specification; matter printed in bold face indicates the additions made by this reissue; a claim printed with strikethrough indicates that the claim was canceled, disclaimed, or held invalid by a prior post-patent action or proceeding.

[[CROSS-REFERENCE TO RELATED APPLICATIONS]]

[This application is a continuation of copending International Application No. PCT/EP2015/055945, filed Mar. 20, 2015, which claims priority from European Application No. 14161605.2, filed Mar. 25, 2014, which are each incorporated herein in its entirety by this reference thereto.] [[This application is a reissue for U.S. Pat. No. 10,074,377, issued 11 Sep. 2018, which was filed as U.S. application Ser. No. 15,272,653 on 22 Sep. 2016, which is a continuation of copending International Application No. PCT/EP2015/055945, filed 20 Mar. 2015, which claims priority from European Application No. 14161605.2, filed 25 Mar. 2014, which are each incorporated herein in its entirety by this reference thereto.]]

CROSS REFERENCE TO RELATED APPLICATIONS

More than one reissue application has been filed for reissue of U.S. Pat. No. RE49107, the first being reissue application No. 18/783,216, filed Jul. 24, 2024, as well as 19/181,967, reissue application No. 19/182,013, reissue application No. 19/182,047, reissue application No. 19/182,088, and reissue application No. 19/182,114, were filed on Apr. 17, 2025, all of which are continuation reissues of U.S. Pat. No. RE49107.

This application is a continuation reissue of U.S. patent application No. 16/404,503, filed May 6, 2019, now U.S. Pat. No. RE49107, issued Jun. 14, 2022, which is a reissue of U.S. patent application No. 15/272,653, filed Sep. 22, 2016, now U.S. Pat. No. 10,074,377, issued Sep. 11, 2018, which is a continuation of International Application No. PCT/EP2015/055945, filed Mar. 20, 2015, which claims priority from European Application No. 141616052, filed Mar. 25, 2014, which are each incorporated herein in its entirety by this reference thereto.

BACKGROUND OF THE INVENTION

Dynamic range control (DRC) in the context of this document refers to a digital signal processing technique to reduce the dynamic range of audio signals in a controlled way [1]. The desired reduction of the dynamic range is achieved by reducing the level of loud sound components and/or amplifying soft parts of the audio signals.

A typical application for DRC is to adapt the dynamic properties of an audio signal to a listening environment. For example, when listening to music in noisy environment, the dynamic range should be reduced in order to allow for an overall signal amplification without driving the resulting amplified signal into clipping. In this case, high signal peaks should be attenuated, e.g. by means of a limiter. Additionally, soft signal components should be amplified relative to the loud parts in order to improve their intelligibility in a noisy listening environment.

SUMMARY

According to an embodiment, an audio encoder device may have: an audio encoder configured for producing an encoded audio bitstream from an audio signal having consecutive audio frames; a dynamic range control encoder configured for producing an encoded dynamic range control bitstream from an dynamic range control sequence corresponding to the audio signal and having consecutive dynamic range control frames, wherein each dynamic range control frame of the dynamic range control frames has one or more nodes, wherein each node of the one or more nodes has gain information for the audio signal and time information indicating to which point in time the gain information corresponds; wherein the dynamic range control encoder is configured in such way that the encoded dynamic range control bitstream has for each dynamic range control frame of the dynamic range control frames a corresponding bitstream portion; wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame.

According to another embodiment, an audio decoder device may have: an audio decoder configured for decoding an encoded audio bitstream in order to reproduce an audio signal having consecutive audio frames; a dynamic range control decoder configured for decoding an encoded dynamic range control bitstream in order to reproduce [an] *a* dynamic range control sequence corresponding to the audio signal and having consecutive dynamic range control frames; wherein the encoded dynamic range control bitstream has for each dynamic range control frame of the dynamic range control frames a corresponding bitstream portion; wherein the encoded dynamic range control bitstream has bit representations of nodes, wherein each bit representation of one node of the nodes has gain information for the audio signal and time information indicating to which point in time the gain information corresponds; wherein the encoded dynamic range control bit stream has bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the dynamic range control decoder is configured for decoding the bit representation of each remaining node of the remaining nodes of the one reference dynamic range control frame of the dynamic range control frames in order to reproduce each remaining node of the one reference dynamic range control frame of the dynamic range control frames, for decoding the bit representation of each shifted node of the shifted nodes selected from the nodes of the one reference dynamic range control frame of the dynamic range control frames in order to reproduce each shifted node of the shifted nodes selected from the nodes of the one reference dynamic range control frame of the dynamic range control frames and for combining the reproduced remaining nodes and the reproduced shifted nodes in order to reconstruct the reference dynamic range control frame.

According to another embodiment, a system may have an audio encoder device, which may have: an audio encoder configured for producing an encoded audio bitstream from an audio signal having consecutive audio frames; a dynamic range control encoder configured for producing an encoded dynamic range control bitstream from [an] *a* dynamic range control sequence corresponding to the audio signal and having consecutive dynamic range control frames, wherein each dynamic range control frame of the dynamic range control frames has one or more nodes, wherein each node of the one or more nodes has gain information for the audio signal and time information indicating to which point in time the gain information corresponds; wherein the dynamic range control encoder is configured in such way that the encoded dynamic range control bitstream has for each dynamic range control frame of the dynamic range control frames a corresponding bitstream portion; wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame, and an audio decoder device according to claim 13.

According to another embodiment, a method for operating an audio encoder may have the steps of: producing an encoded audio bitstream from an audio signal having consecutive audio frames; producing an encoded dynamic range control bitstream from [an] *a* dynamic range control sequence corresponding to the audio signal and having consecutive dynamic range control frames, wherein each dynamic range control frame of the dynamic range control frames has one or more nodes, wherein each node of the one or more nodes has gain information for the audio signal and time information indicating to which point in time the gain information corresponds, wherein the encoded dynamic range control bitstream has for each dynamic range control frame of the dynamic range control frames a corresponding bitstream portion; executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame.

According to another embodiment, a method for operating an audio decoder may have the steps of: decoding an encoded audio bitstream in order to reproduce an audio signal having consecutive audio frames; decoding an encoded dynamic range control bitstream in order to reproduce [an] *a* dynamic range control sequence corresponding to the audio signal and having consecutive dynamic range control frames; wherein the encoded dynamic range control bitstream has for each dynamic range control frame of the dynamic range control frames a corresponding bitstream portion; wherein the encoded dynamic range control bitstream has bit representations of nodes, wherein each bit representation of one node of the nodes has gain information for the audio signal and time information indicating to which point in time the gain information corresponds; wherein the encoded dynamic range control bit stream has bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the bit representation of each remaining node of the remaining nodes of the one reference dynamic range control frame of the dynamic range control frames is decoded in order to reproduce each remaining node of the one reference dynamic range control frame of the dynamic range control frames; wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames; and wherein the reproduced remaining nodes and the reproduced shifted nodes are combined in order to reconstruct the reference dynamic range control frame.

According to another embodiment, a non-transitory digital storage medium may have a computer program stored thereon to perform the inventive methods when said computer program is run by a computer.

The invention addresses the situation of audio transmission using coding of the audio signal, wherein the gain information is not directly applied to the audio signal, but also encoded and transmitted together with the encoded audio signal. At the decoder, both, the audio signal and the gain information, may be decoded and the gain information may be applied to the corresponding audio signal. As explained more detailed below, the invention achieves an efficient coding of the gain information. More precisely, it avoids bitrate peaks in the encoded dynamic range control bitstream.

The process of applying dynamic range control to an audio signal can be expressed by a simple multiplication of the audio signal x(k) by a time-variant gain value g(k):

$$y(k)=g(k)\times(k) \quad (1)$$

where k denotes a sample time index. The value of the gain g(k) may be computed, e.g. based on a short-term estimate of the root-mean square of the audio signal x(k). More details about strategies to determine suitable gains values are discussed in [1]. In the following we refer to the time-variant gains g(k) as a gain sequence.

In the following, the coding of dynamic range control gain sequences is explained. First, the dynamic range control gain sequence is divided into so-called dynamic range control frames of gain samples, containing a fixed number of gain samples. Usually, a temporal frame size for the dynamic range control frames is chosen to be equal to the temporal size of an audio frame of the corresponding audio encoder. Within each dynamic range control frame, so-called nodes are selected, advantageously on a uniform time grid.

The spacing of this grid defines the highest available time resolution, i.e., the minimum distance in samples between two nodes equals to samples having the highest available time resolution. Each node is represented by the sample position within the dynamic range control frame, the gain information, which may be expressed as a gain value, for that position and optionally information about the slope of the gain values at the node positions. For the following discussion it will be useful to define the maximum number of nodes that can be selected within one frame.

The dynamic range control encoder encodes the gain information from the nodes, e.g., by using quantized differential values of pairs of consecutive gain nodes. At the decoder, the original gain sequence is reconstructed as good as possible by using spline interpolation or linear interpolation based on the transmitted information of the nodes (gain value, sample position within the dynamic range control frame, and slope information if applicable).

An efficient approach for encoding the dynamic range control gain sequence is to use a quantized value of the gain difference (typically in dB) of pairs of consecutive nodes, as well as the time difference of the sample positions of these nodes within the considered dynamic range control frame. The slope information is usually not represented as a difference between two nodes. Since there is no preceding node for the first node within a frame, its gain value is not encoded in a differential way, but the values are encoded explicitly. The time difference of the first node is usually determined as the offset to the beginning of the dynamic range control frame.

The encoder may then assign a fixed code word e.g. of a pre-defined Huffman table (code book) to each of the gain and time differences of pairs of nodes.

At the dynamic range control decoder, the dynamic range control bitstream is decoded and the relevant information (gain value, sample position within the dynamic range control frame, and slope information if applicable) at the positions of the transmitted nodes is reconstructed. The gain values for the remaining gain samples within a frame are obtained by interpolation between pairs of transmitted and decoded nodes. The interpolation can be based on splines if the slope information of the gain nodes has been transmitted or, alternatively, using linear interpolation if only the gain differences between pairs of nodes are available and the slope information is discarded.

In principle, dynamic range control encoder/decoder chains can be operated in two modes. The so-called full-frame mode refers to the case where after decoding of a received dynamic range control bitstream, corresponding to a reference dynamic range control frame, the gains at each sample position of the reference dynamic range control frame can be immediately determined after interpolation based on the decoded nodes. This implies that a node has to be transmitted at each frame border, i.e., at the sample position corresponding to the last sample of the reference dynamic range control frame. If the dynamic range control frame length is N this means the last transmitted node has to be located at the sample position N within the reference dynamic range control frame.

The invention avoids this disadvantage as it is based on the second mode, which is referred to as "delay mode". In this case, there is no need for transmitting a node for the last sample position within the reference dynamic range control frame. Therefore, the dynamic range control decoder has to wait for decoding the dynamic range control frame subsequent to the reference dynamic range control frame in order to perform the interpolation that may be used of all gain values following the last node within reference dynamic range control frame. This is because the information of the first node of the subsequent dynamic range control frame has to be known to perform the interpolation between the last node of the reference dynamic range control frame and the first node of the subsequent dynamic range control frame in order to determine the gain value in between via interpolation.

In practice the delay caused by using the delay mode for coding of the dynamic range control information is not an issue. This is because audio codecs that commonly accompany the dynamic range control coding scheme also introduce an inherent delay of one audio frame when subsequently applying the encoding and decoding steps. Important examples of such audio codecs are the ISO/IEC 13818-7, Advanced Audio Coding (MPEG-2 AAC), ISO/IEC 14496-3, subpart 4 (MPEG-4 AAC), or ISO/IEC 23003-3, part 3, Unified Speech and Audio Coding (USAC). Such audio coding schemes use the reference audio frame and the audio frame subsequent to the reference audio frame in order to compute (using an overlap-add structure) the correct audio samples corresponding to the reference dynamic range control audio frame.

It is important to note that the number of nodes that may be used for sufficiently approximating the original dynamic range control gain sequence significantly varies from dynamic range control frame to dynamic range control frame. That results from the fact that more nodes may be used for representing highly time-variant gains compared to the case where only slowly changing gain values have to be encoded. This observation implies that the bitrate that may be used to transmit gain sequences can vary significantly from frame to frame. Some frames may involve a large number of nodes being encoded, resulting in high bitrate peaks. This is not desirable, especially, when the audio signal and the dynamic range control gain sequence are transmitted in a joint bitstream having the encoded dynamic range control bitstream and the encoded audio bitstream, which should have almost constant bitrate. Then, a peak in the dynamic range control related bitrate reduces the available bitrate for the audio encoder, which often result in a degradation of the audio quality after decoding. However, with the current state-of-the-art methods for the coding of dynamic range control gain sequences, a reduction of the dynamic range control related bitrate in a certain frame is only achieved by reducing the number of nodes that are selected to represent the gain sequence within that frame. This again may lead to large errors between the original gain sequence and the one that is reconstructed after the dynamic range control decoding process. The invention overcomes these disadvantages by reducing the peak bitrates of encoded dynamic range control bitstream without increasing the error between the original and the reconstructed dynamic range control sequence.

In this section, the coding of dynamic range control gain sequences according to the invention is presented. The invention allows controlling the peak bitrate that may be used for a reference dynamic range control frame without changing the resulting bitstream sequence compared to the case where the proposed method is not used. The proposed approach exploits the inherent delay of one frame introduced by state-of-the-art audio coders to reduce peaks of number of nodes within one frame by distributing the transmission of some of the nodes to the next subsequent dynamic range control frame. The details of the proposed method are presented in the following.

As explained above, when combined with an audio coding scheme that introduces a frame delay relative to the dynamic range control gains, the decoded dynamic range control gains are delayed by one frame before being applied to the audio signal. This means that the nodes of the reference dynamic range control frame are applied to the valid audio decoder output at dynamic range control frame subsequent to the reference dynamic range control frame. This implies that in the default delay mode it is sufficient to transmit the nodes of the reference dynamic range control frame together with the nodes of the dynamic range control frame subsequent to the reference dynamic range control frame and apply the corresponding dynamic range control gains without a delay directly to the corresponding audio output signal at the decoder.

This fact is exploited in the invention in order to reduce the maximum number of nodes transmitted within one dynamic range control frame. According to the invention some of the nodes of the reference dynamic range control frame are shifted to the subsequent dynamic range control frame, which may be done before encoding. As it will be discussed in the following, the shifted nodes may be "preceding" the first node in the subsequent dynamic range control frame only for the encoding of the gain differences and the slope information. For the coding of the time difference information, a different method may be applied.

According to an advantageous embodiment of the invention the shift procedure is initiated in case that a number of the nodes of the reference dynamic range control frame is greater than a predefined threshold value.

According to an advantageous embodiment of the invention the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a predefined threshold value.

According to an advantageous embodiment of the invention the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a number of the nodes of the dynamic range control frame subsequent to the reference dynamic range control frame.

Independent from the conditions defined under which the shift procedure is initiated, the first node of the reference dynamic range control frame should not be shifted to the subsequent dynamic range control frame as its value is needed for interpolation of the gain control values at the beginning of the reference dynamic range control frame. Furthermore, a node should be shifted only one time in order to avoid a delay when decoding the bitstream.

According to an advantageous embodiment of the invention the time information of the one or more nodes is represented in such way that the one or more shifted nodes may be identified by using the time information.

According to an advantageous embodiment of the invention the time information of the one or more shifted nodes is represented by a sum of a time difference from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.

According to an advantageous embodiment of the invention the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation of the respective shifted node and the gain value of the bit representation of the node, which precedes the bit representation of the respective node.

According to an advantageous embodiment of the invention, in case that the bit representations of one or more shifted nodes of the reference dynamic range control frame is embedded in the bitstream portion corresponding to the dynamic range control frame subsequent to the reference dynamic range control frame, the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.

According to an advantageous embodiment of the invention a temporal size of the audio frames is equal to a temporal size of the dynamic range control frames.

According to an advantageous embodiment of the invention the one or more nodes of one of the dynamic range control frame are selected from a uniform time grid.

According to an advantageous embodiment of the invention each node of the one or more nodes comprises slope information.

According to an advantageous embodiment of the invention the dynamic range control encoder is configured for encoding the nodes using an entropy encoding technique, such as Huffman coding or arithmetic coding.

The encoder may assign a fixed code word e.g. of a pre-defined Huffman table (code book) to each of the gain and time differences of pairs of nodes. Examples of suitable Huffman tables for encoding the time differences of pairs of consecutive nodes are given in Table 1 and Table 2, respectively.

TABLE 1

Example of a Huffman table for the coding of time differences of DRC gain nodes.

| Codeword size [bits] | Time difference binary encoding | Time difference tDrcDelta in multiples of deltaTmin |
|---|---|---|
| 1 | 0 × 000 | nNodesMax |
| 3 | 0 × 004 | 1 |
| 5 | 0 × 014 + (a − 2) | a = [2 . . . 5] |
| 6 | 0 × 030 + (a − 6) | a = [6 . . . 13] |
| 12 | 0 × E00 + (a − 14) | a = [14 . . . 2*nNodesMax − 1] |

TABLE 2

Example of a Huffman table for the coding of time differences of DRC gain nodes, where Z = ceil (log2(2*nNodesMax))

| Encoding | Size | Time difference in multiples of deltaTmin | Range |
|---|---|---|---|
| 00 | 2 bits | tDrcDelta = 1 | 1 |
| {01, μ} | {2 bits, 2 bits} | tDrcDelta = μ + 2 | 2 . . . 5 |
| {10, μ} | {2 bits, 3 bits} | tDrcDelta = μ + 6 | 6 . . . 13 |
| {11, μ} | {2 bits, Z bits} | tDrcDelta = μ + 14 | 14 . . . 2*nNodesMax |

In a further aspect of the invention the objective is achieved by an audio decoder device comprising:

an audio decoder configured for decoding an encoded audio bitstream in order to reproduce an audio signal comprising consecutive audio frames;

a dynamic range control decoder configured for decoding an encoded dynamic range control bitstream in order to reproduce [an] *a* dynamic range control sequence corresponding to the audio signal and comprising consecutive dynamic range control frames;

wherein the encoded dynamic range control bitstream comprises for each dynamic range control frame of the dynamic range control frames a corresponding bitstream portion;

wherein the encoded dynamic range control bitstream comprises bit representations of nodes, wherein each bit representation of one node of the nodes comprises gain information for the audio signal AS and time information indicating to which point in time the gain information corresponds;

wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the dynamic range control decoder is configured for decoding the bit representation of each remaining node of the remaining nodes of the one reference dynamic range control frame of the dynamic range control frames in order to reproduce each remaining node of the one reference dynamic range control frame of the dynamic range control frames, for decoding the bit representation of each shifted node of the shifted nodes selected from the nodes of the one reference dynamic range control frame of the dynamic range control frames in order to reproduce each shifted node of the shifted nodes selected from the nodes of the one reference dynamic range control frame of the dynamic range control frames and for combining the reproduced remaining nodes and the reproduced shifted nodes in order to reconstruct the reference dynamic range control frame.

The dynamic range control decoder receives the dynamic range control bitstream. The dynamic range control bitstream, which corresponds to the node information (sample position, gain value, and slope information if applicable), may be decoded in the following way:

A value for the time difference between two nodes (e.g. as an integer multiple of the minimum distance between two nodes) is determined from the received code word based e.g. on the rules shown in a Huffman code book. The corresponding sample position of the currently decoded node is obtained by adding the time difference value to the sample position value computed for the previous node.

After decoding the nodes of the reference dynamic range control frame the nodes of the subsequent dynamic range control frame are decoded.

If the determined sample position within the subsequent dynamic range control frame corresponds to a value that is larger than the length of a subsequent dynamic range control frame, the dynamic range control decoder knows that the current temporal node information refers to a node originally located in the reference dynamic range control frame.

To obtain the correct sample position within the reference dynamic range control frame, an offset is subtracted from the computed sample position. A practical example is to subtract the value that corresponds to the length of a dynamic range control frame (which implies that the encoder has added the same value to the original sample position). A typical example for the offset value is the temporal size of a dynamic range control frame.

After decoding and if applicable correcting the time information of all nodes in the entire subsequent dynamic range control frame, the decoder knows how many nodes have been shifted back to the reference dynamic range control frame (without explicitly providing this information at the encoder) and on which sample position they are located within the reference dynamic range control frame.

The dynamic range control decoder further determines the gain value information of all nodes of a received frame by decoding the differential gain information in the bitstream.

From the decoding step of the time information, the decoder knows how many of the decoded gain values have to be assigned to the nodes of the reference dynamic range control frame (and to which sample position) and which gain values are assigned to nodes in the reference dynamic range control frame.

The decoding of the slope information and the assignment to the correct nodes are performed analogously to the decoding process of the gain values.

After decoding all nodes of the subsequent dynamic range control frame, it can be assured that all nodes that may be used for computing the gain values for each sample of the reference dynamic range control frame via interpolation are available. After the interpolation step, the dynamic range control gain values for each sample can be applied to the corresponding correct audio samples.

According to an advantageous embodiment of the invention the dynamic range control decoder is configured for identifying the one or more shifted nodes by using the time information.

According to an advantageous embodiment of the invention the dynamic range control decoder is configured for decoding the time information of the one or more shifted nodes, which is represented by a sum of a time from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.

According to an advantageous embodiment of the invention the dynamic range control decoder is configured for decoding the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation of the respective shifted node and the gain value of the bit representation of the node, which precedes the bit representation of the respective node.

According to an advantageous embodiment of the invention the dynamic range control decoder is configured for decoding the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.

According to an advantageous embodiment of the invention a temporal size of the audio frames is equal to a temporal size of the dynamic range control frames.

According to an advantageous embodiment of the invention the one or more nodes of one of the dynamic range control frames are selected from a uniform time grid.

According to an advantageous embodiment of the invention each node of the one or more nodes comprises slope information.

According to an advantageous embodiment of the invention the dynamic range control decoder is configured for decoding the bit representations of the nodes using an entropy decoding technique.

The objective is further obtained by a system comprising an audio encoder device according to the invention and an audio decoder device according to the invention.

The invention further provides a method for operating an audio encoder, the method comprises the steps:

producing an encoded audio bitstream from an audio signal comprising consecutive audio frames;

producing an encoded dynamic range control bitstream from [an] *a* dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;

wherein the encoded dynamic range control bitstream comprises for each dynamic range control frame of the dynamic range control frames a corresponding bitstream portion;

executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame.

The invention further provides a method for operating an audio decoder, the method comprises the steps:

decoding an encoded audio bitstream in order to reproduce an audio signal comprising consecutive audio frames;

decoding an encoded dynamic range control bitstream in order to reproduce [an] *a* dynamic range control sequence corresponding to the audio signal and comprising consecutive dynamic range control frames;

wherein the encoded dynamic range control bitstream comprises for each dynamic range control frame of the dynamic range control frames a corresponding bitstream portion;

wherein the encoded dynamic range control bitstream comprises bit representations of nodes, wherein each bit representation of one node of the nodes comprises gain information for the audio signal [AS] and time information indicating to which point in time the gain information corresponds;

wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the bit representation of each remaining node of the remaining nodes of the one reference dynamic range control frame of the dynamic range control frames is decoded in order to reproduce each remaining node of the one reference dynamic range control frame of the dynamic range control frames;

wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames; and wherein the reproduced remaining nodes and the reproduced shifted nodes are combined in order to reconstruct the reference dynamic range control frame.

In another aspect the invention provides a program for, when running on a processor, executing the method according to the invention.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
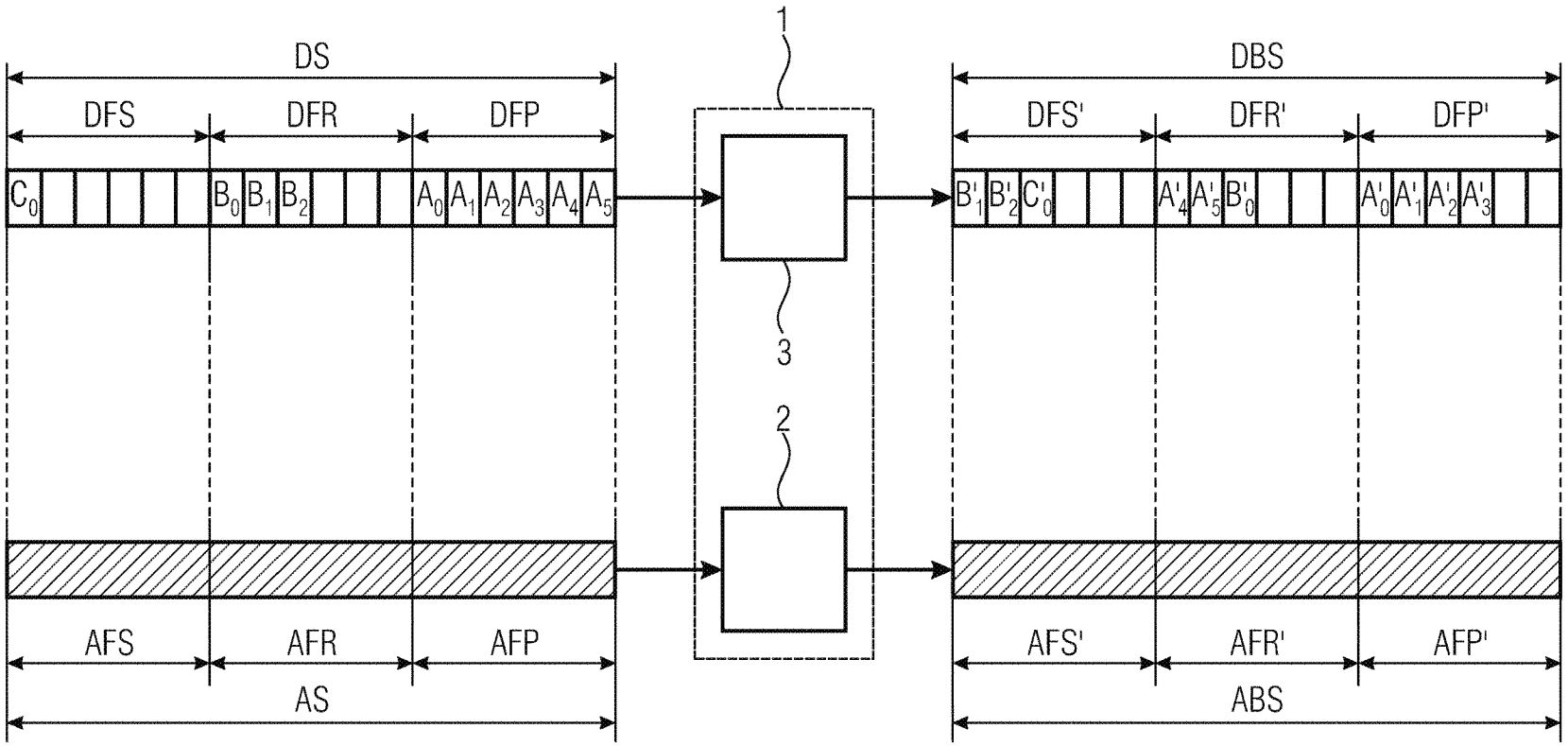
FIG. 1 illustrates an embodiment of an audio encoder device according to the invention in a schematic view.

FIG. 1 illustrates an embodiment of an audio encoder device 1 according to the invention in a schematic view. The audio encoder device 1 comprises:

an audio encoder 2 configured for producing an encoded audio bitstream ABS from an audio signal AS comprising consecutive audio frames AFP, AFR, AFS;

a dynamic range control encoder 3 configured for producing an encoded dynamic range control bitstream DBS from an dynamic range control sequence DS corresponding to the audio signal AS and comprising consecutive dynamic range control frames DFP, DFR, DFS, wherein each dynamic range control frame DFP, DFR, DFS of the dynamic range control frames DFP, DFR, DFS comprises one or more nodes $A_0 \ldots A_5$; $B_0 \ldots B_2$; $C_0$, wherein each node of the one or more nodes $A_0 \ldots A_5$; $B_0 \ldots B_2$; $C_0$ comprises gain information $GA_0 \ldots GA_5$; $GB_0 \ldots GB_2$; $GC_0$ for the audio signal AS and time information $TA_0 \ldots TA_5$; $TB_0 \ldots TB_2$; $TC_0$ indicating to which point in time the gain information $GA_0 \ldots GA_5$; $GB_0 \ldots GB_2$; $GC_0$ corresponds;

wherein the dynamic range control encoder 3 is configured in such way that the encoded dynamic range control bitstream DBS comprises for each dynamic range control frame DFP, DFR, DFS of the dynamic range control frames DFP, DFR, DFS a corresponding bitstream portion DFP', DFR', DFS';

wherein the dynamic range control encoder 2 is configured for executing a shift procedure, wherein one or more nodes $B_1$, $B_2$ of the nodes $B_0 \ldots B_2$ of one reference dynamic range control frame DFR of the dynamic range control frames DFP, DFR, DFS are selected as shifted nodes $B_1$, $B_2$, wherein a bit representation $B'_1$, $B'_2$ of each of the one or more shifted nodes $B_1$, $B_2$ of the one reference dynamic range control frame DFR is embedded in the bitstream portion DFS' corresponding to the dynamic range control frame DFS subsequent to the one reference dynamic range control frame DFR, wherein a bit representation $B'_0$ of each remaining node $B_0$ of the nodes $B_0 \ldots B_2$ of the one reference dynamic range control frame DFR of the dynamic range control frames DFP, DFR, DFS is embedded into the bitstream portion DFR' corresponding to the one reference dynamic range control frame DFR. The invention allows controlling the peak bitrate that may be used for a reference dynamic range control frame DFR without changing the resulting bitstream sequence DBS compared to the case where the proposed method is not used. The proposed approach exploits the inherent delay of one frame introduced by state-of-the-art audio coders to reduce peaks of number of nodes within one frame by distributing the transmission of some of the nodes to the next subsequent dynamic range control frame. The details of the proposed method are presented in the following.

As explained above, when combined with an audio coding scheme that introduces a frame delay relative to the dynamic range control gains, the decoded dynamic range control gains are delayed by one frame before being applied to the audio signal. This means that the nodes of the reference dynamic range control frame are applied to the valid audio decoder output at dynamic range control frame subsequent to the reference dynamic range control frame. This implies that in the default delay mode it is sufficient to transmit the nodes of the reference dynamic range control frame together with the nodes of the dynamic range control frame subsequent to the reference dynamic range control frame and apply the corresponding dynamic range control gains without a delay directly to the corresponding audio output signal at the decoder.

This fact is exploited in the invention in order to reduce the maximum number of nodes transmitted within one dynamic range control frame. According to the invention some of the nodes of the reference dynamic range control frame are shifted to the subsequent dynamic range control frame, which may be done before encoding. As it will be discussed in the following, the shifted nodes may be "preceding" the first node in the subsequent dynamic range control frame only for the encoding of the gain differences and the slope information. For the coding of the time difference information, a different method may be applied.

In the example shown in FIG. 1 the preceding dynamic range control frame DFP contains six nodes $A_0 \ldots A_5$ of which the nodes $A_4$, $A_5$ are shifted into the bitstream portion DFR'. Furthermore, the reference dynamic range control frame DFR contains three nodes $B_0 \ldots B_2$. The sum of the number of the shifted nodes $A_4$, $A_5$ and the nodes $B_0 \ldots B_2$ of the reference dynamic range control frame DFR is equal to five which is bigger than the number of the nodes $C_0$ of the subsequent dynamic range control frame DFS so that a shift procedure is initiated in such way that nodes $B_1$, $B_2$ are shifted into the bitstream portion DFS'. Although the maximum number of nodes within the dynamic range control frames DFS, DFR, DFP is equal to six, is the maximum number of nodes within the bitstream portions DFS', DFR', DFP' own equal to four so that bitstream peak is avoided.

According to an advantageous embodiment of the invention a temporal size of the audio frames AFP, AFR, AFS is equal to a temporal size of the dynamic range control frames DFP, DFR, DFS.

According to an advantageous embodiment of the invention the one or more nodes $A_0 \ldots A_5$; $B_0 \ldots B_2$; $C_0$ of one of the dynamic range control frame DFP, DFR, DFS are selected from a uniform time grid.

According to an advantageous embodiment of the invention the dynamic range control encoder 3 is configured for encoding the nodes $A_0 \ldots A_5$; $B_0 \ldots B_2$; $C_0$ using an entropy encoding technique.

In a further aspect the invention provides a method for operating an audio encoder 1, the method comprises the steps:

producing an encoded audio bitstream ABS from an audio signal AS comprising consecutive audio frames AFP, AFR, AFS;

producing an encoded dynamic range control bitstream DBS from an dynamic range control sequence DS corresponding to the audio signal AS and comprising consecutive dynamic range control frames DFP, DFR, DFS, wherein each dynamic range control frame DFP, DFR, DFS of the dynamic range control frames DFP, DFR, DFS comprises one or more nodes $A_0 \ldots A_5$; $B_0 \ldots B_2$; $C_0$, wherein each node of the one or more nodes $A_0 \ldots A_5$; $B_0 \ldots B_2$; $C_0$ comprises gain information $GA_0 \ldots GA_5$; $GB_0 \ldots GB_2$; $GC_0$ for the audio signal AS and time information $TA_0 \ldots TA_5$; $TB_0 \ldots TB_2$; $TC_0$ indicating to which point in time the gain information corresponds wherein the encoded dynamic range control bitstream DBS comprises for each dynamic range control frame DFP, DFR, DFS of the dynamic range control frames DFP, DFR, DFS a corresponding bitstream portion DFP', DFR', DFS';

executing a shift procedure, wherein one or more nodes $B_1$, $B_2$ of the nodes $B_0 \ldots B_2$ of one reference dynamic range control frame DFR of the dynamic range control frames DFP, DFR, DFS are selected as shifted nodes $B_1$, $B_2$, wherein a bit representation $B'_1$, $B'_2$ of each of the one or more shifted nodes $B_1$, $B_2$ of the one reference dynamic range control frame DFR is embedded in the bitstream portion DFS' corresponding to the dynamic range control frame DFS subsequent to the one reference dynamic range control frame DFR, wherein a bit representation $B'_0$ of each remaining node $B_0$ of the nodes $B_0 \ldots B_2$ of the one reference dynamic range control frame DFR of the dynamic range control frames DFP, DFR, DFS is embedded into the bitstream portion DFR' corresponding to the one reference dynamic range control frame DFR.

Figure 2:
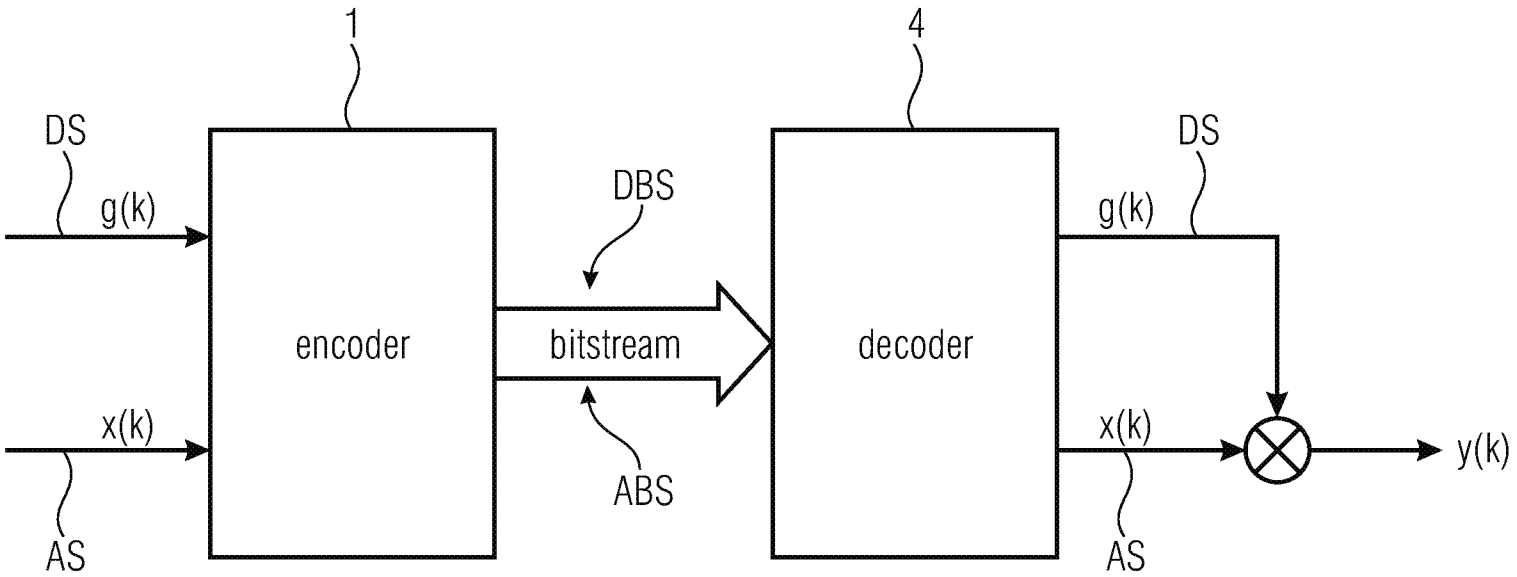
FIG. 2 illustrates the principle of dynamic range control applied in the context of audio coding in a schematic view.

FIG. 2 illustrates the principle of dynamic range control applied in the context of audio coding in a schematic view.

The process of applying DRC to a signal can be expressed by a simple multiplication of the audio signal x(k) by a time-variant gain value g(k):

$$y(k)=g(k)\times(k) \tag{1}$$

where k denotes a sample time index. The value of the gain g(k) is computed, e.g. based on a short-term estimate of the root-mean square of the input signal x(k). More details about strategies to determine suitable gains values are discussed in [1]. In the following we refer to the time-variant gains g(k) as a gain sequence.

The invention refers to an application scenario, where both, the audio signal AS and the dynamic range control sequence DS are coded and transmitted. In this case, the dynamic range control gains are not directly applied to the audio signal AS, but encoded and transmitted together with the encoded audio signal ABS. At the decoder 4, both, the audio signal AS and the dynamic range control sequence DS are decoded and the dynamic range control information is applied to the corresponding audio signal AS.

In one aspect the invention provides a system comprising an audio encoder device 1 according to the invention and an audio decoder device 4 according to the invention.

Figure 3:
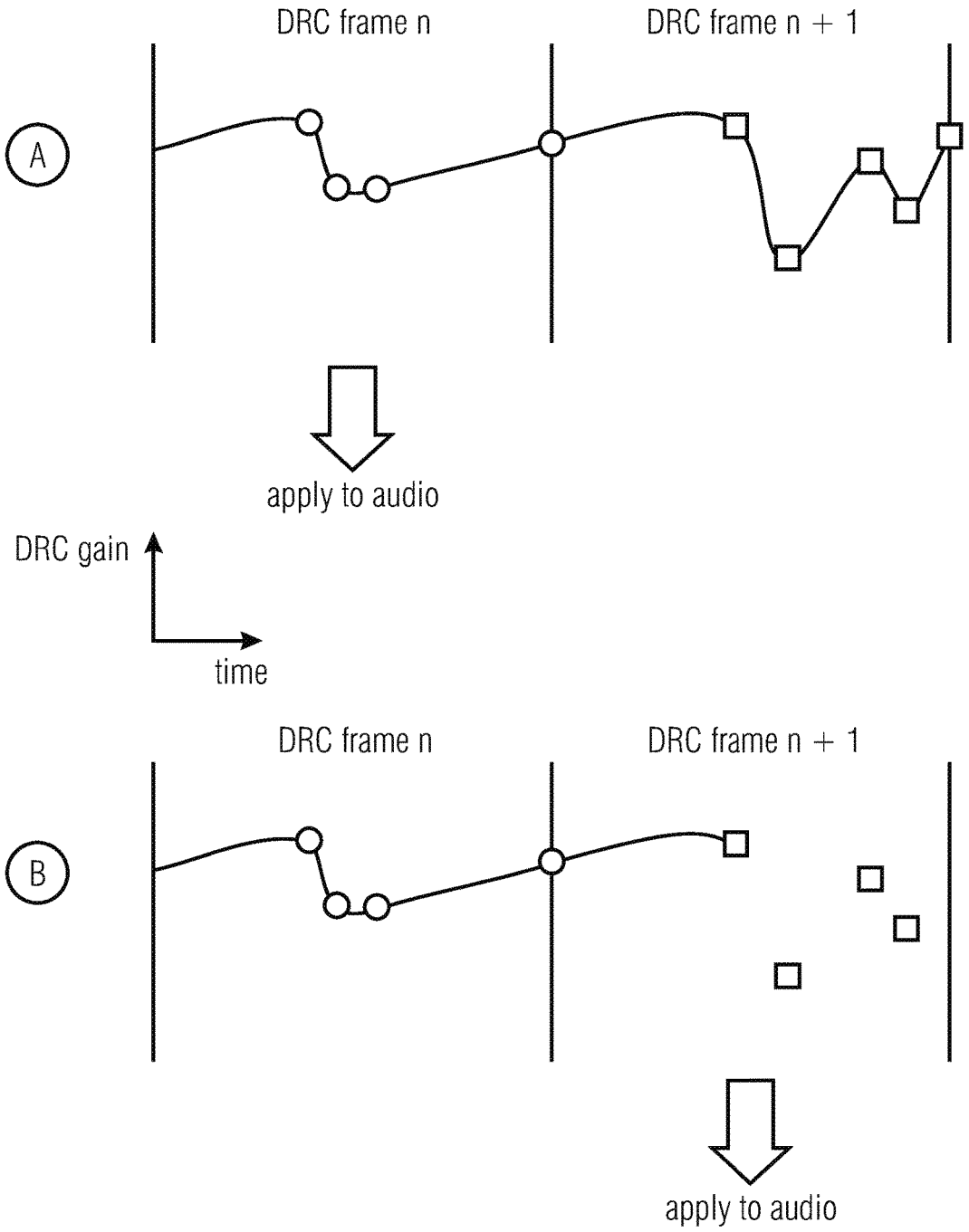
FIG. 3 illustrates the different modes for the coding of dynamic range control gain sequences in a schematic view.

FIG. 3 illustrates the different modes for the coding of dynamic range control gain sequences in a schematic view, namely the full-frame mode (A) and delay mode (B). Gain nodes received in frame n are shown as circles and gain nodes received frame n+1 are shown as squares. The solid line illustrates the interpolated DRC gain up to DRC frame n+1.

In principle, the dynamic range control encoder/decoder chain can be operated in two modes. The so-called full-frame mode refers to the case where after decoding of a received dynamic range control bitstream, corresponding to a specific dynamic range control frame, the gains at each sample position of the dynamic range control frame can be immediately determined after interpolation based on the decoded nodes. This implies that a node has to be transmitted at each frame border, i.e., at the sample position corresponding to the last sample of the dynamic range control frame. If the dynamic range control frame length is N this means the last transmitted node has to be located at the sample position N within that frame. This is illustrated at the top in FIG. 3 denoted by "A". As shown, the dynamic range control gains of the nth frame can immediately be applied to the corresponding audio frame.

The second mode is referred to as "delay mode" and it is illustrated in the lower part "B" of FIG. 3. In this case, there is no node transmitted for the last sample position within frame n. Therefore, the DRC decoder has to wait for decoding the DRC frame n+1 in order to perform the interpolation that may be used of all gain values following the last node within frame n. This is because the information of the first node of frame n+1 has to be known to perform the interpolation between the last node of frame n and the first node in frame n+1 in order to determine the gain value in between via interpolation.

Figure 4:
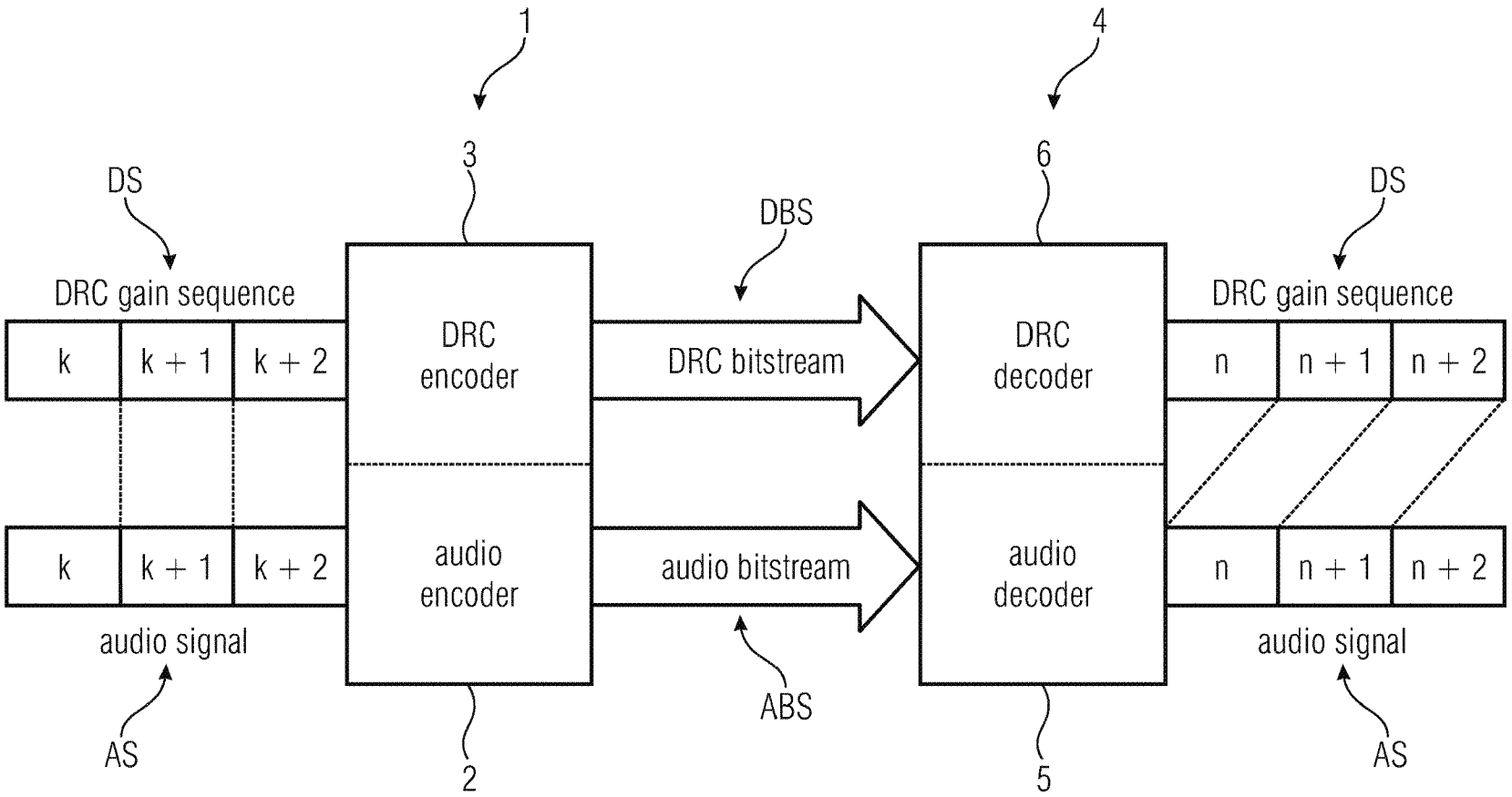
FIG. 4 illustrates the application of dynamic range control in the context of audio coding in a schematic view.

FIG. 4 illustrates the application of dynamic range control in the context of audio coding in a schematic view where the audio coder introduces one frame delay relative to the dynamic range coding scheme.

Figure 5:
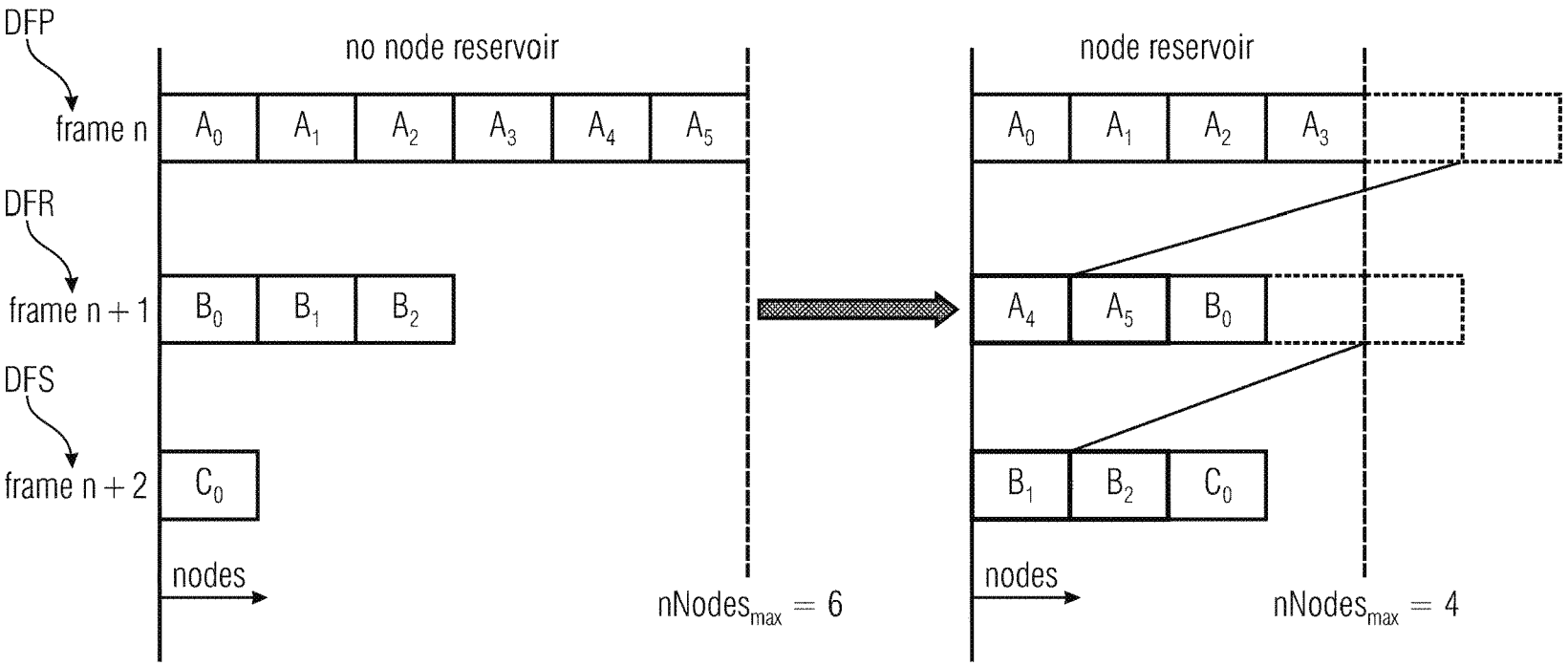
FIG. 5 illustrates a shift procedure for nodes according to the invention in a schematic view.

FIG. 5 illustrates a shift procedure for nodes according to the invention in a schematic view. The left-hand side shows the situation when using a state-of-the-art approach, whereas the right-hand side shows the proposed method, where each square corresponds to a node $A_0 \ldots A_5$; $B_0 \ldots B_2$; $C_0$.

According to an advantageous embodiment of the invention the shift procedure is initiated in case that a number of the nodes $B_0 \ldots B_2$ of the reference dynamic range control frame DFR is greater than a predefined threshold value.

According to an advantageous embodiment of the invention the shift procedure is initiated in case that a sum of a number of the nodes $B_0 \ldots B_2$ of the reference dynamic range control frame DFR and a number of shifted nodes $A_4$, $A_5$ from the dynamic range control frame DFP preceding the reference dynamic range control frame DFR to be embedded in the bitstream portion DFR' corresponding to the reference dynamic range control frame DFR is greater than a predefined threshold value.

According to an advantageous embodiment of the invention the shift procedure is initiated in case that a sum of a number of the nodes $B_0 \ldots B_2$ of the reference dynamic range control frame DFR and a number of shifted nodes $A_4$, $A_5$ from the dynamic range control frame DFP preceding the reference dynamic range control frame DFR to be embedded in the bitstream portion DFR' corresponding to the reference dynamic range control frame DFR is greater than a number of the nodes $C_0$ of the dynamic range control frame DFS subsequent to the reference dynamic range control frame DFR.

As explained above, when combined with an audio coding scheme that introduces a frame delay relative to the dynamic range control frames, the decoded dynamic range control gains are delayed by one frame before being applied to the audio signal. Considering the left-hand side in FIG. 5, this means that the nodes $A_i$ of the nth frame are applied to the valid audio decoder output at frame n+1. This implies that in the default delay mode it would be sufficient to transmit the nodes $A_i$ together with the node $B_0$ in frame n+1 and apply the corresponding DRC gains without a delay directly to the corresponding audio output signal at the decoder.

This fact is exploited in the proposed method to reduce the maximum number of nodes transmitted within one frame. This is illustrated on the right-hand side in FIG. 4. The nodes $A_4$ and $A_5$ are shifted to frame n+1 before encoding, i.e., the maximum number of nodes in frame n is reduced from 6 to 4 in the given example. As it will be discussed in the following, the nodes $A_4$ and $A_5$ are "preceding" the first node in frame n+1, i.e., $B_0$ only for the encoding of the gain differences and the slope information. For the coding of the time difference information, a different method has to be applied.

Figure 6:
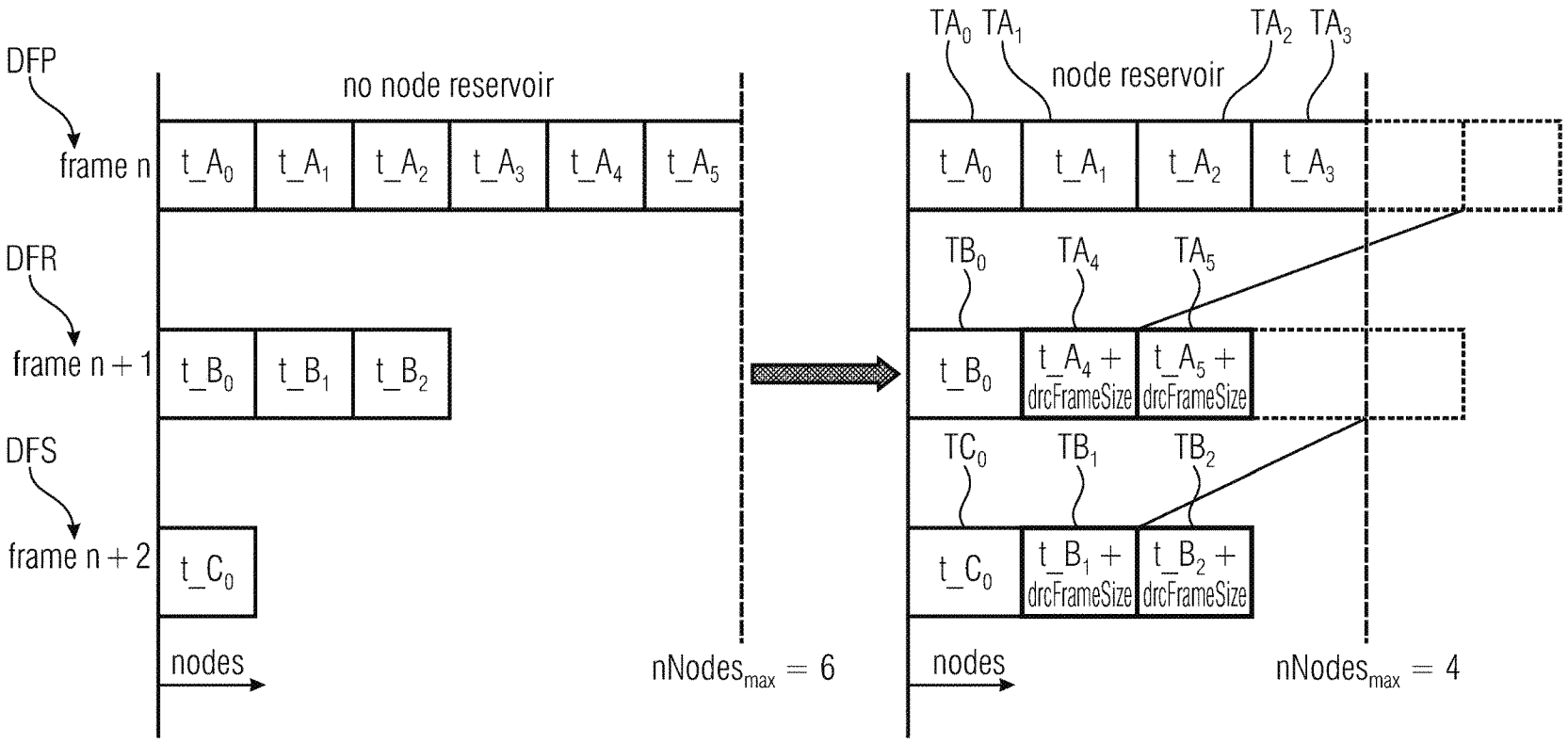
FIG. 6 illustrates the coding of time information according to the invention in a schematic view.

FIG. 6 illustrates the coding of time information according to the invention in a schematic view.

According to an advantageous embodiment of the invention the time information $TA_0 \ldots TA_5$; $TB_0 \ldots TB_2$; $TC_0$ of the one or more nodes $A_0 \ldots A_5$; $B_0 \ldots B_2$; $C_0$ is represented in such way that the one or more shifted nodes $A_4$, $A_5$; $B_1$, $B_2$ may be identified by using the time information $TA_4$, $TA_5$; $TB_1$, $TB_2$.

According to an advantageous embodiment of the invention the time information $TA_4$, $TA_5$; $TB_1$, $TB_2$ of the one or more shifted nodes $A_4$, $A_5$; $B_1$, $B_2$ is represented by a sum of a time difference $t_A_4$, $t_A_5$; $t_B_2$ from a beginning of the dynamic range control frame DFP; DFR to which the respective node $A_4$, $A_5$; $B_1$, $B_2$ belongs to the temporal position of the respective node $A_4$, $A_5$; $B_1$, $B_2$ within the dynamic range control frame DFP; DFR to which the respective node $A_4$, $A_5$; $B_1$, $B_2$ belongs and an offset value drcFrameSize being greater than or equal to a temporal size of the dynamic range control frame DFR; DFS subsequent to the respective dynamic range control frame DFP; DFR.

First we consider the encoding of the time differences between pairs of nodes. In FIG. 6 the situation for determining the time differences for pairs of nodes is depicted for the example according to FIG. 4, where $t_A_i$ denotes the sample position of node A on the grid of possible node positions within a frame. As discussed earlier nodes can be selected on a uniform time grid, where the spacing of this grid defines the highest available time resolution deltaTmin. Thus, the time information $t_A_i$ is given in samples, where the time differences between two nodes are integer multiples of deltaTmin.

The temporal position information of a node is encoded in a differential way, i.e., relative to the position of the previous node. If a node is the first node within a frame, the time difference is determined relative to the beginning of a frame. The left-hand side of FIG. 6 depicts the situation if no node shifting is applied. In this case, the differential time information of node $A_4$ $tDrcDelta_A_4$ is computed as $tDrcDelta_A_4 = t_A_4 - t_A_3$. This differential time value is then encoded using the corresponding entry in an appropriate Huffman table, e.g. according to Table 1 or 2. As another example we look at the encoded time difference of node $B_0$. Since it is the first node of frame n+1, the corresponding time difference is determined relative to the beginning of the frame, i.e. $tDrcDelta_B_0 = t_B_0$.

Let us now consider the encoding of the node position for the proposed node reservoir technique using node shifting. For the example shown on the right-hand side of FIG. 6, the nodes $A_4$ and $A_5$ have been shifted to the next frame for encoding. The representation of nodes $A_0$ to $A_3$ has not changed and the encoded time differences are therefore also not changed. The same is true for the encoded position information of node $B_0$. However, the time information of node $A_4$ and node $A_5$ is now processed differently. As shown in FIG. 6, the original value $t_A_4$ indicating the sample position of node $A_4$ is modified at the encoder by adding an offset of drcFrameSize. Since the resulting position information exceeds the maximum value that would be possible in case of regular encoding, the offset indicates the decoder that the corresponding node has to be further processed within the context of the previous frame. Furthermore, the decoder knows that the original sample position $t_A_4$ is obtained by subtracting the offset drcFrameSize from the decoded value.

Next, we consider the computation of the time difference information that is actually encoded for the situation shown on the right-hand side of FIG. 6. For coding efficiency reasons, the differential position information for node $A_4$ is computed relative to node $B_0$. In contrast to the situation previously discussed for the left-hand side of FIG. 6, the differential time information is now computed according to $tDrcDelta_A_4 = t_A_4 + drcFrameSize - t_B_0$, i.e., by including the offset. Analogously, for node $A_5$ we obtain $tDrcDelta_A_5 = t_A_5 + drcFrameSize - t_A_4 - drcFrameSize$, which obviously is the same as $tDrcDelta_A_5 = t_A_5 - t_A_4$. These differential time values are encoded using the corresponding code word entry of the correct Huffman table, e.g. according to Table 1 or 2.

The method for decoding the temporal position information can be summarized as follows. The decoder extracts the time difference information of a node based on the corresponding code word from the bitstream. The time information is obtained by adding the time difference information to the time information of the previous node. If the resulting sample position is larger than drcFrameSize the decoder knows that the present node has to be processed as if it were the last node in the previous frame, i.e., it has to be appended to the nodes decoded in the previous frame. The correct sample position is determined by subtracting the offset value drcFrameSize from the decoded time value. The same processing steps are applied in an analog way if more shifted nodes occur in a decoded frame.

After decoding and correcting the time information of an entire frame, the decoder knows how many nodes have been shifted back to the previous frame (without explicitly providing this information at the encoder) and on which sample position they are located within the previous frame. The information about the number of shifted nodes will be further exploited in the context of decoding gain and slope information described below.

Figure 7:
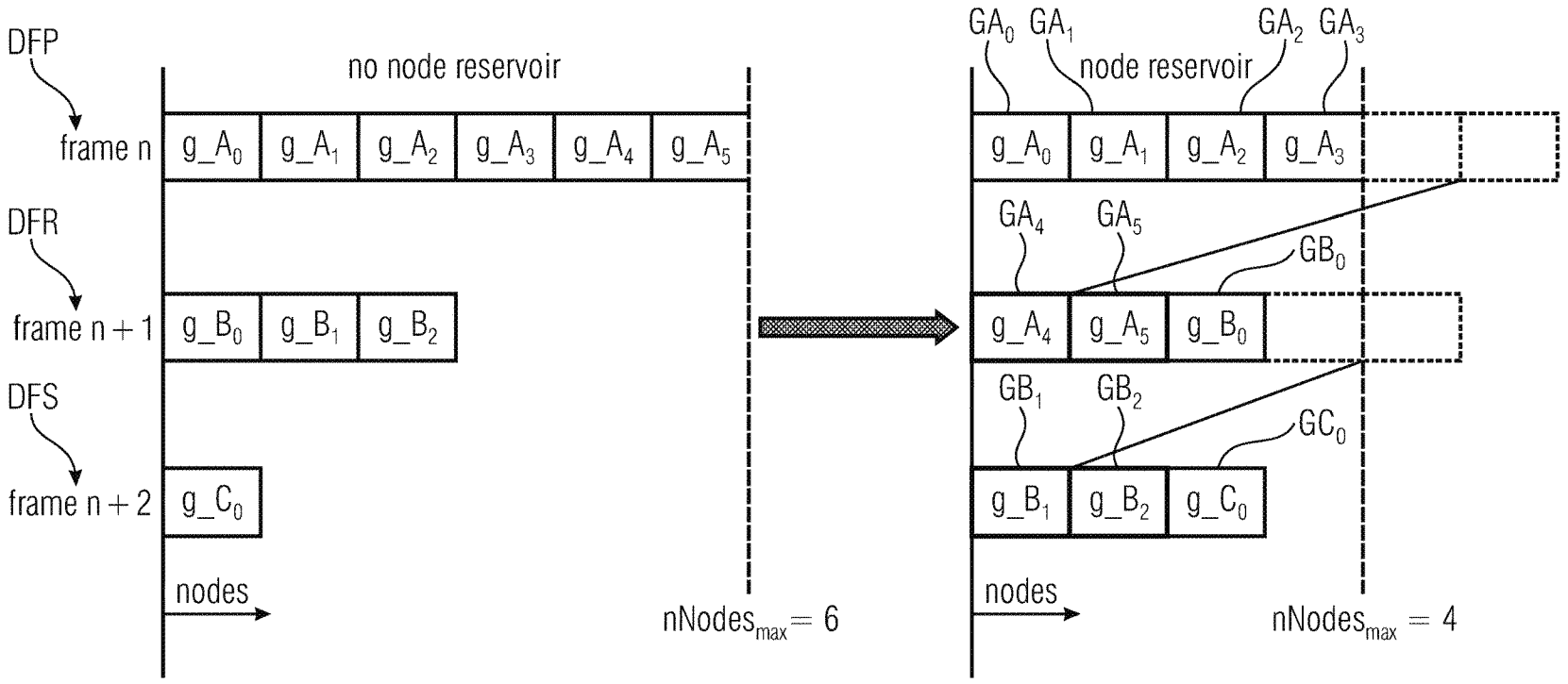
FIG. 7 illustrates the coding of gain information according to the invention in a schematic view.

FIG. 7 illustrates the coding of gain information according to the invention in a schematic view.

According to an advantageous embodiment of the invention the gain information $GB_1$ of the bit representation $B'_1$ of the shifted node $B_1$, which is at a first position of the bitstream portion DFS' corresponding to the dynamic range control frame DFS subsequent to the reference dynamic range control frame DFR, is represented by an absolute gain value $g_B_1$ and wherein the gain information $GB_2$ of each bit representation $B'_2$ of the shifted nodes $B_2$ at a position after the bit representation $B'_1$ of the node $B_1$, which is at the first position of the bitstream portion DFS' corresponding to the dynamic range control frame DFS subsequent to the reference dynamic range control frame DFR, is represented by a relative gain value which is equal to a difference of a gain value $g_B_2$ of the bit representation $B'_2$ of the respective shifted node $B_2$ and the gain value $g_B_1$ of the bit representation $B'_1$ of the [nodeB$_1$] *node $B_1$*, which precedes the bit representation $B'_2$ of the respective [nodeB$_2$] *node $B_2$*.

According to an advantageous embodiment of the invention, in case that the bit representations $B'_1$, $B'_2$ of one or more shifted nodes $B_1$, $B_2$ of the reference dynamic range control frame DFR is embedded in the bitstream portion DFS' corresponding to the dynamic range control frame DFS subsequent to the reference dynamic range control frame DFR, the gain information $GC_0$ of the bit representation $C'_0$ of the node $C_0$ of the subsequent dynamic range control frame DFS at a first position of the bitstream portion DFS' corresponding to the dynamic range control frame DFS subsequent to the reference dynamic range control frame DFR after the one or more positions of the bit representations $B'_1$, $B'_2$ of the one or more shifted nodes $B_1$, $B_2$ is represented by a relative gain value which is equal to a difference of a gain value $g_C_0$ of the bit representation $C'_0$ of the respective node $C_0$ and a gain value $g_B_2$ of the bit representation $B'_2$ of the shifted [nodeB$_2$] *node $B_2$*, which precedes the bit representation $C'_0$ of the respective node $C_0$.

In FIG. 7 the situation for determining the gain differences for pairs of nodes is depicted for the example according to FIG. 5, where $g_A_i$ denotes the gain value of node $A_i$.

First, the differential gain values for the node $A_4$ is considered. For the approach without node reservoir, depicted on the left-hand side of FIG. 7, the differential gain value gain $Delta_A_4$ is computed from the difference of the gain value (in dB) of the preceding node $A_3$ and the node $A_4$, i.e., $gainDelta_A_4=g_A_4-g_A_3$. This differential gain value is then encoded using the corresponding entry in an appropriate Huffman table. Furthermore, we consider the first node of frame n+1 on the left-hand side of FIG. 7. Since $B_0$ is the first node of that frame, it gain value is not encoded in a differential way, but according to a specific coding of initial gain values gainInitial, i.e., the gain value is encoded as its actual value: $gainDelta_B_0=g_B_0$.

For the situation shown on the right-hand side, where the node $A_4$ has been shifted to the next frame n+1, the values of the encoded gain information is different. As can be seen, after being shifted, the node $A_4$ becomes the first node in frame n+1 with respect to encoding the gain differences. Thus, its gain value is not encoded in a differential way, but the specific coding of initial gain values is applied as described above. The differential gain value of $A_5$ will remain the same for both situations shown on the left- and the right-hand side. Since node $B_0$ now follows node $A_5$ if the node reservoir is used, its gain information will be determined from the difference of the gains of node $B_0$ and $A_5$, i.e., $gainDelta_B_0=g_B_0-g_A_5$. Note that only the way how the gain differences are determined changes when applying the node reservoir technique, whereas the reconstructed values of the gains remain the same for each node. Obviously, after decoding the entire gain related information of the frames n and n+1, the obtained gain values for the nodes $A_0$ to $B_0$ are identical to that obtained in the left-hand side, and the nodes can be computed "in time" for application of the DRC gains to the corresponding audio frame.

As discussed in the previous paragraph, the number of shifted nodes and their sample position within the previous frame are known after decoding the time difference information. As illustrated on the right-hand side of FIG. 6, the gain values of shifted nodes from frame n start immediately from the beginning of the received gain information of frame n+1. Therefore, the information on the number of shifted nodes is sufficient for the decoder to assign each gain value to the correct sample position within the correct frame. Considering the example shown on the right-hand side in FIG. 6, the decoder knows that the first two decoded gain values of frame n+1 have to be appended to the last gain values of the previous frame, whereas the third gain value corresponds to the correct gain value of the first node in the current frame.

Figure 8:
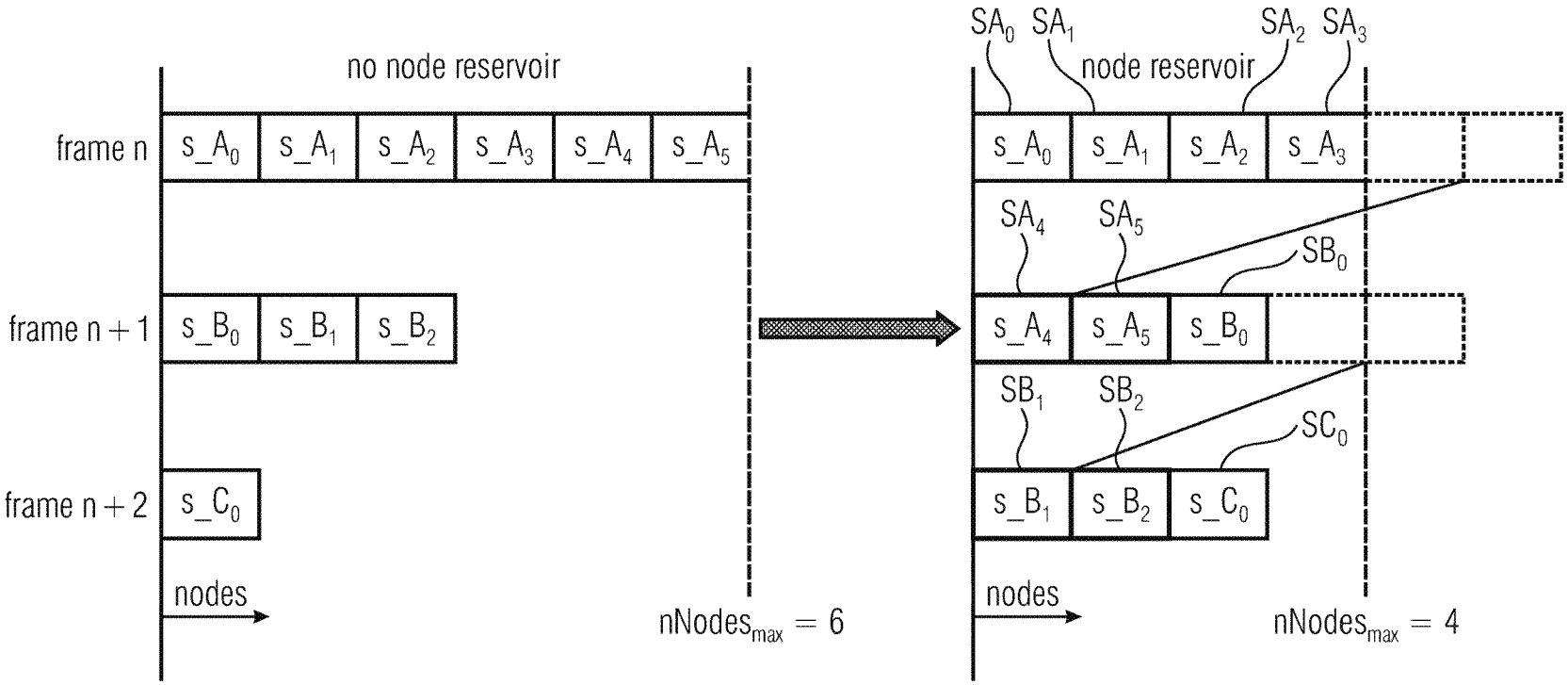
FIG. 8 illustrates the coding of slope information according to the invention in a schematic view.

FIG. 8 illustrates the coding of slope information according to the invention in a schematic view.

According to an advantageous embodiment of the invention each node $A_0 \ldots A_5$; $B_0 \ldots B_2$; $C_0$ of the one or more nodes comprises $A_0 \ldots A_5$; $B_0 \ldots B_2$; $C_0$ slope information $SA_0 \ldots SA_5$; $SB_0 \ldots SB_2$, $SC_0$.

Next, the coding of slope information is considered, which is illustrated in FIG. 8. The slope information of the nodes isn't encoded in a differential way between pairs of nodes, but for each node independently. Therefore, the slope related information remains unchanged in both cases with and without usage of the node reservoir. As in case of coding of gain values, the Huffman tables for generating the code words for slope information remain the same for both cases, with and without using the proposed node shifting. The assignment of the slope information to the correct sample position within the correct frame is performed analogously to the case of decoding the gain values.

After all nodes information received for frame n+1 have been decoded and if applicable shifted back to the preceding frame n, the gain interpolation for frame n using splines or linear interpolation can be performed in the common way and the gain values are applied to the corresponding audio frame.

Figure 9:
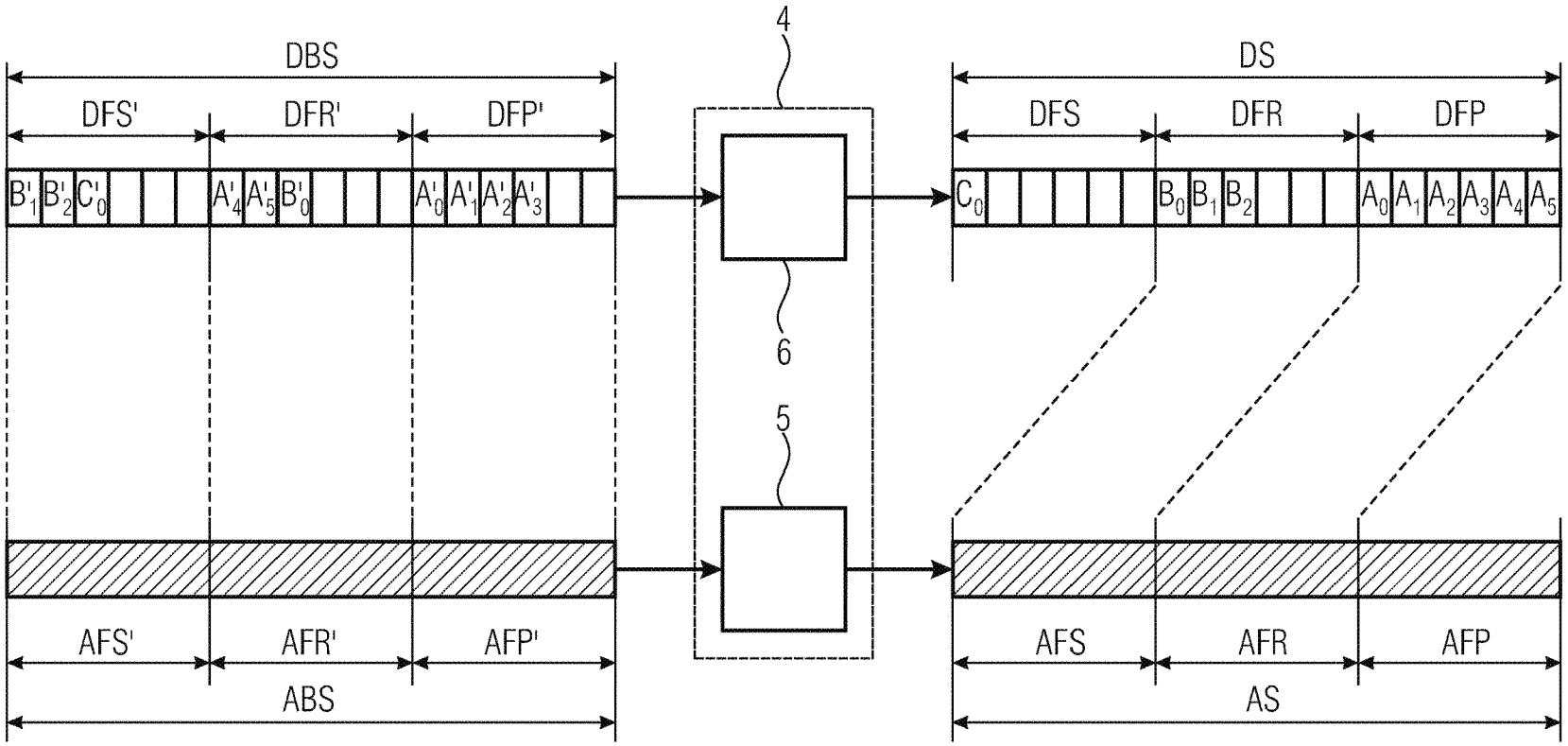
FIG. 9 illustrates an embodiment of an audio decoder device according to the invention in a schematic view.

FIG. 9 illustrates an embodiment of an audio decoder device according to the invention in a schematic view. The audio decoder device 4 comprises:

an audio decoder 5 configured for decoding an encoded audio bitstream ABS in order to reproduce an audio signal AS comprising consecutive audio frames AFP, AFR, AFS;

a dynamic range control decoder 6 configured for decoding an encoded dynamic range control bitstream DBS in order to reproduce an dynamic range control sequence DS corresponding to the audio signal AS and comprising consecutive dynamic range control frames DFP, DFR, DFS;

wherein the encoded dynamic range control bitstream DBS comprises for each dynamic range control frame DFP, DFR, DFS of the dynamic range control frames a corresponding bitstream portion DFP', DFR', DFS';

wherein the encoded dynamic range control bitstream DBS comprises bit representations $A'_0 \ldots A'_5$; $B'_0 \ldots B'_2$; $C'_0$ of nodes $A_0 \ldots A_5$; $B_0 \ldots B_2$; $C_0$; wherein each bit representation of one node of the nodes comprises gain information $GA_0 \ldots GA_5$; $GB_0 \ldots GB_2$; $GC_0$ for the audio signal AS and time information $TA_0 \ldots TA_5$; $TB_0 \ldots TB_2$; $TC_0$ indicating to which point in time the gain information $GA_0 \ldots GA_5$; $GB_0 \ldots GB_2$; $GC_0$ corresponds;

wherein the encoded dynamic range control bit stream DBS comprises bit representations $B'_1$, $B'_2$ of shifted nodes $B_1$, $B_2$ selected from the nodes $B_0 \ldots B_2$ of one reference dynamic range control frame DFR of the dynamic range control frames DFP, DFR, DFS, which are embedded in a bitstream portion corresponding to the dynamic range control frame DFS subsequent to the one reference dynamic range control frame DFR, wherein the bit representation $B'_0$ of each remaining node $B_0$ of the nodes $B_0 \ldots B_2$ of the one reference dynamic range control frame DFR of the dynamic range control frames DFP, DFR, DFS is embedded into the bitstream portion DFR' corresponding to the one reference dynamic range control frame DFR; and wherein the dynamic range control decoder 6 is configured for decoding the bit representation $B'_0$ of each remaining node $B_0$ of the remaining nodes $B'_0$ of the one reference dynamic range control frame DFR of the dynamic range control frames DFP, DFR, DFS in order to reproduce each remaining node $B_0$ of the one reference dynamic range control frame DFR of the dynamic range control frames DFP, DFR, DFS, for decoding the bit representation $B'_1$, $B'_2$ of each shifted node $B_1$, $B_2$ of the shifted nodes $B_1$, $B_2$ selected from the nodes $B_0 \ldots B_2$ of the one reference dynamic range control frame DFR of the dynamic range control frames DFP, DFR, DFS in order to reproduce each shifted node $B_1$, $B_2$ of the shifted nodes $B_1$, $B_2$ selected from the nodes of the one reference dynamic range control frame DFR of the dynamic range control frames DFP, DFR, DFS and for combining the reproduced remaining nodes $B_0$ and the reproduced shifted nodes $B_1$, $B_2$ in order to reconstruct the reference dynamic range control frame DFR.

According to an advantageous embodiment of the invention the dynamic range control decoder 6 is configured for identifying the one or more shifted nodes $A_4$, $A_5$; $B_1$, $B_2$ by using the time information $TA_4$, $TA_5$; $TB_1$, $TB_2$.

According to an advantageous embodiment of the invention the dynamic range control decoder 6 is configured for decoding the time information $TA_4$, $TA_5$; $TB_1$, $TB_2$ of the one or more shifted nodes $A_4$, $A_5$; $B_1$, $B_2$, which is represented by a sum of a time difference $t_A_4$, $t_A_5$; $t_B_1$, $t_B_2$ from a beginning of the dynamic range control frame DFP; DFR to which the respective node $A_4$, $A_5$; $B_1$, $B_2$ belongs to the temporal position of the respective node $A_4$, $A_5$; $B_1$, $B_2$ within the dynamic range control frame DFP; DFR to which the respective node $A_4$, $A_5$; $B_1$, $B_2$ belongs and an offset value drcFrameSize being greater than or equal to a temporal size of the dynamic range control frame DFR; DFS subsequent to the respective dynamic range control frame DFP; DFR.

According to an advantageous embodiment of the invention the dynamic range control decoder 6 is configured for decoding the gain information $GB_1$ of the bit representation $B'_1$ of the shifted node $B_1$, which is at a first position of the bitstream portion DFS' corresponding to the dynamic range control frame DFS subsequent to the reference dynamic range control frame DFR, is represented by an absolute gain value $g_B_1$ and wherein the gain information $GB_2$ of each bit representation $B'_2$ of the shifted nodes $B_2$ at a position after the bit representation $B'_1$ of the node $B_1$, which is at the first position of the bitstream portion DFS' corresponding to the dynamic range control frame DFS subsequent to the reference dynamic range control frame DFR, is represented by a relative gain value which is equal to a difference of a gain value $g_B_2$ of the bit representation $B'_2$ of the respective shifted node $B_2$ and the gain value $g_B_1$ of the bit representation $B'_1$ of the node$B_1$, which precedes the bit representation $B'_2$ of the respective [node$B_2$ ] *node $B_2$*.

According to an advantageous embodiment of the invention the dynamic range control decoder 6 is configured for decoding the gain information $GC_0$ of the bit representation $C'_0$ of the node $C_0$ of the subsequent dynamic range control frame DFS at a first position of the bitstream portion DFS' corresponding to the dynamic range control frame DFS subsequent to the reference dynamic range control frame DFR after the one or more positions of the bit representations $B'_1$, $B'_2$ of the one or more shifted nodes $B_1$, $B_2$ is represented by a relative gain value which is equal to a difference of a gain value $g_C_0$ the bit representation $C'_0$ of the respective node $C_0$ and the gain value $g_B_2$ of the bit representation $B'_2$ of the shifted [node$B_2$] *node $B_2$*, which precedes the bit representation $C'_0$ of the respective node $C_0$.

According to an advantageous embodiment of the invention a temporal size of the audio frames AFP, AFR, AFS is equal to a temporal size of the dynamic range control frames AFP, AFR, AFS.

According to an advantageous embodiment of the invention the one or more nodes $A_0 \ldots A_5$; $B_0 \ldots B_2$; $C_0$ of one of the dynamic range control frames DFP, DFR, DFS are selected from a uniform time grid.

According to an advantageous embodiment of the invention each node $A_0 \ldots A_5$; $B_0 \ldots B_2$; $C_0$ of the one or more nodes $A_0 \ldots A_5$; $B_0 \ldots B_2$; $C_0$ comprises slope information $SA_0 \ldots SA_5$, $SB_0 \ldots SB_2$; $SC_0$.

According to an advantageous embodiment of the invention the dynamic range control decoder 6 is configured for decoding the bit representations of the nodes $A'_0 \ldots A'_5$; $B'_0 \ldots B'_2$, $C_0$ using an entropy decoding technique.

In another aspect the invention provides a method for operating an audio decoder, the method comprises the steps:

decoding an encoded audio bitstream ABS in order to reproduce an audio signal AS comprising consecutive audio frames AFP, AFR, AFS;

decoding an encoded dynamic range control bitstream DBS in order to reproduce an dynamic range control sequence DS corresponding to the audio signal AS and comprising consecutive dynamic range control frames DFP, DFR, DFS;

wherein the encoded dynamic range control bitstream DBS comprises for each dynamic range control frame DFP, DFR, DFS of the dynamic range control frames a corresponding bitstream portion DFP', DFR', DFS';

wherein the encoded dynamic range control bitstream DBS comprises bit representations $A'_0 \ldots A'_5$; $B'_0 \ldots B'_2$; $C'_0$ of nodes $A_0 \ldots A_5$; $B_0 \ldots B_2$; $C_0$, wherein each bit representation of one node of the nodes comprises gain information $GA_0 \ldots GA_5$; $GB_0 \ldots GB_2$; $GC_0$ for the audio signal AS and time information $TA_0 \ldots TA_5$; $TB_0 \ldots TB_2$; $TC_0$ indicating to which point in time the gain information $GA_0 \ldots GA_5$; $GB_0 \ldots GB_2$; $GC_0$ corresponds;

wherein the encoded dynamic range control bit stream DBS comprises bit representations $B'_1$, $B'_2$ of shifted nodes $B_1$, $B_2$ selected from the nodes $B_0 \ldots B_2$ of one reference dynamic range control frame DFR of the dynamic range control frames DFP, DFR, DFS, which are embedded in a bitstream portion corresponding to the dynamic range control frame DFS subsequent to the one reference dynamic range control frame DFR, wherein the bit representation $B'_0$ of each remaining node $B_0$ of the nodes $B_0 \ldots B_2$ of the one reference dynamic range control frame DFR of the dynamic range control frames DFP, DFR, DFS is embedded into the bitstream portion DFR' corresponding to the one reference dynamic range control frame DFR; and wherein the bit representation $B'_0$ of each remaining node $B_0$ of the remaining nodes $B'_0$ of the one reference dynamic range control frame DFR of the dynamic range control frames DFP, DFR, DFS is decoded in order to reproduce each remaining node $B_0$ of the one reference dynamic range control frame DFR of the dynamic range control frames DFP, DFR, DFS;

wherein the bit representation $B'_1$, $B'_2$ of each shifted node $B_1$, $B_2$ of the shifted nodes $B_1$, $B_2$ selected from the nodes $B_0 \ldots B_2$ of the one reference dynamic range control frame DFR of the dynamic range control frames DFP, DFR, DFS is decoded in order to reproduce each shifted node $B_1$, $B_2$ of the shifted nodes $B_1$, $B_2$ selected from the nodes of the one reference dynamic range control frame DFR of the dynamic range control frames DFP, DFR, DFS; and wherein the reproduced remaining nodes $B_0$ and the reproduced shifted nodes $B_1$, $B_2$ are combined in order to reconstruct the reference dynamic range control frame DFR.

With respect to the decoder, the encoder and the methods of the described embodiments the following shall be mentioned:

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, which is stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may be configured, for example, to be transferred via a data communication connection, for example via the Internet.

A further embodiment comprises a processing means, for example a computer, or a programmable logic device, configured or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] D. Giannoulis, M. Massberg, J. D. Reiss, "Digital Dynamic Range Compressor Design—A Tutorial and Analysis" J. Audio Engineering Society, Vol. 60, No. 6, June 2012. in

The invention claimed is:

1. An audio encoder device comprising:

an audio encoder configured for producing an encoded audio bitstream from an audio signal comprising consecutive audio frames;

a dynamic range control encoder configured for producing an encoded dynamic range control bitstream from [an] *a* dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;

wherein the dynamic range control encoder is configured in such way that the encoded dynamic range control bitstream comprises for each dynamic range control frame of the dynamic range control frames a corresponding bitstream portion;

wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame.

2. The audio encoder device according to claim 1, wherein the shift procedure is initiated in case that a number of the nodes of the reference dynamic range control frame is greater than a predefined threshold value.

3. The audio encoder device according to claim 1, wherein the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a predefined threshold value.

4. The audio encoder device according to claim 1, wherein the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a number of the nodes of the dynamic range control frame subsequent to the reference dynamic range control frame.

[5. The audio encoder device according to claim 1, wherein the time information of the one or more nodes is represented in such way that the one or more shifted nodes may be identified by using the time information.]

6. The audio encoder device according to claim [5] *55*, wherein the time information of the one or more shifted nodes is represented by a sum of a time difference from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.

[7. The audio encoder device according to claim 1, wherein the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation of the respective shifted node and a gain value of the bit representation of the node, which precedes the bit representation of the respective node.]

8. The audio encoder device according to claim 1, wherein, in case that the bit representations of one or more shifted nodes of the reference dynamic range control frame is embedded in the bitstream portion corresponding to the dynamic range control frame subsequent to the reference dynamic range control frame, the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.

9. The audio encoder device according to claim 1, wherein a temporal size of the audio frames is equal to a temporal size of the dynamic range control frames.

10. The audio encoder device according to claim 1, wherein the one or more nodes of one of the dynamic range control frame are selected from a uniform time grid.

11. The audio encoder device according to claim 1, wherein each node of the one or more nodes comprises slope information.

12. The audio encoder device according to claim 1, wherein the dynamic range control encoder is configured for encoding the nodes using an entropy encoding technique.

13. An audio decoder device comprising:

an audio decoder configured for decoding an encoded audio bitstream in order to reproduce an audio signal comprising consecutive audio frames;

a dynamic range control decoder configured for decoding an encoded dynamic range control bitstream in order to reproduce [an] *a* dynamic range control sequence corresponding to the audio signal and comprising consecutive dynamic range control frames;

wherein the encoded dynamic range control bitstream comprises for each dynamic range control frame of the dynamic range control frames a corresponding bitstream portion;

wherein the encoded dynamic range control bitstream comprises bit representations of nodes, wherein each bit representation of one node of the nodes comprises gain information for the audio signal and time information indicating to which point in time the gain information corresponds;

wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the dynamic range control decoder is configured for decoding the bit representation of each remaining node of the remaining nodes of the one reference dynamic range control frame of the dynamic range control frames in order to reproduce each remaining node of the one reference dynamic range control frame of the dynamic range control frames, for decoding the bit representation of each shifted node of the shifted nodes selected from the nodes of the one reference dynamic range control frame of the dynamic range control frames in order to reproduce each shifted node of the shifted nodes selected from the nodes of the one reference dynamic range control frame of the dynamic range control frames and for combining the reproduced remaining nodes and the reproduced shifted nodes in order to reconstruct the reference dynamic range control frame.

14. The audio decoder device according to claim 13, wherein the dynamic range control decoder is configured for identifying the one or more shifted nodes by using the time information.

15. The audio decoder device according to claim 13, wherein the dynamic range control decoder is configured for decoding the time information of the one or more shifted nodes, which is represented by a sum of a time difference from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.

16. The audio decoder device according to claim 13, wherein the dynamic range control decoder is configured for decoding the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation $B'_2$ of the respective shifted node $B_2$ and a gain value of the bit representation of the node, which precedes the bit representation of the respective node.

17. The audio decoder device according to claim 13, wherein the dynamic range control decoder is configured for decoding the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.

18. The audio decoder device according to claim 13, wherein a temporal size of the audio frames is equal to a temporal size of the dynamic range control frames.

19. The audio decoder device according to claim 13, wherein the one or more nodes of one of the dynamic range control frames are selected from a uniform time grid.

20. The audio decoder device according to claim 13, wherein each node of the one or more nodes comprises slope information.

21. The audio decoder device according to claim 13, wherein the dynamic range control decoder is configured for decoding the bit representations of the nodes using an entropy decoding technique.

22. A system comprising an audio encoder device comprising:

an audio encoder configured for producing an encoded audio bitstream from an audio signal comprising consecutive audio frames;

a dynamic range control encoder configured for producing an encoded dynamic range control bitstream from [an] *a* dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;

wherein the dynamic range control encoder is configured in such way that the encoded dynamic range control bitstream comprises for each dynamic range control frame of the dynamic range control frames a corresponding bitstream portion;

wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame, and an audio decoder device according to claim 13.

23. A method for operating an audio encoder, the method comprising:

producing an encoded audio bitstream from an audio signal comprising consecutive audio frames;

producing an encoded dynamic range control bitstream from [an] *a* dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;

wherein the encoded dynamic range control bitstream comprises for each dynamic range control frame of the dynamic range control frames a corresponding bitstream portion;

executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame.

24. A method for operating an audio decoder, the method comprising:

decoding an encoded audio bitstream in order to reproduce an audio signal comprising consecutive audio frames;

decoding an encoded dynamic range control bitstream in order to reproduce [an] *a* dynamic range control sequence corresponding to the audio signal and comprising consecutive dynamic range control frames;

wherein the encoded dynamic range control bitstream comprises for each dynamic range control frame of the dynamic range control frames a corresponding bitstream portion;

wherein the encoded dynamic range control bitstream comprises bit representations of nodes, wherein each bit representation of one node of the nodes comprises gain information for the audio signal and time information indicating to which point in time the gain information corresponds;

wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the bit representation of each remaining node of the remaining nodes of the one reference dynamic range control frame of the dynamic range control frames is decoded in order to reproduce each remaining node of the one reference dynamic range control frame of the dynamic range control frames;

wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames; and wherein the reproduced remaining nodes and the reproduced shifted nodes are combined in order to reconstruct the reference dynamic range control frame.

25. A non-transitory digital storage medium having a computer program stored thereon to perform the method for operating an audio encoder, the method comprising:

producing an encoded audio bitstream from an audio signal comprising consecutive audio frames;

producing an encoded dynamic range control bitstream from [an] *a* dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds*;* wherein the encoded dynamic range control bitstream comprises for each dynamic range control frame of the dynamic range control frames a corresponding bitstream portion;

executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame, when said computer program is run by a computer.

26. A non-transitory digital storage medium having a computer program stored thereon to perform the method for operating an audio decoder, the method comprising:

decoding an encoded audio bitstream in order to reproduce an audio signal comprising consecutive audio frames;

decoding an encoded dynamic range control bitstream in order to reproduce [an] *a* dynamic range control sequence corresponding to the audio signal and comprising consecutive dynamic range control frames;

wherein the encoded dynamic range control bitstream comprises for each dynamic range control frame of the dynamic range control frames a corresponding bitstream portion;

wherein the encoded dynamic range control bitstream comprises bit representations of nodes, wherein each bit representation of one node of the nodes comprises gain information for the audio signal and time information indicating to which point in time the gain information corresponds;

wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame, wherein the bit representation of each remaining node of the nodes of the one reference dynamic range control frame of the dynamic range control frames is embedded into the bitstream portion corresponding to the one reference dynamic range control frame; and wherein the bit representation of each remaining node of the remaining nodes of the one reference dynamic range control frame of the dynamic range control frames is decoded in order to reproduce each remaining node of the one reference dynamic range control frame of the dynamic range control frames;

wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames; and wherein the reproduced remaining nodes and the reproduced shifted nodes are combined in order to reconstruct the reference dynamic range control frame, when said computer program is run by a computer.

*27. An audio encoder device comprising:*

*an audio encoder configured for producing an encoded audio bitstream from an audio signal comprising consecutive audio frames;*

*a dynamic range control encoder configured for producing an encoded dynamic range control bitstream from a dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;*

*wherein the dynamic range control encoder is configured in such way that the encoded dynamic range control bitstream comprises for each dynamic range control frame of the dynamic range control frames a corresponding bitstream portion;*

*wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic*

*range control frame subsequent to the one reference dynamic range control frame.*

*28. The audio encoder device according to claim 27, wherein a bit representation of each remaining node of the nodes of the one reference dynamic range control frame of the dynamic range control frames is embedded into the bitstream portion corresponding to the one reference dynamic range control frame.*

*29. The audio encoder device according to claim 27, wherein the shift procedure is initiated in case that a number of the nodes of the reference dynamic range control frame is greater than a predefined threshold value.*

*30. The audio encoder device according to claim 27, wherein the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a predefined threshold value.*

*31. The audio encoder device according to claim 27, wherein the shift procedure is initiated in case that a sum of a number of the nodes of the reference dynamic range control frame and a number of shifted nodes from the dynamic range control frame preceding the reference dynamic range control frame to be embedded in the bitstream portion corresponding to the reference dynamic range control frame is greater than a number of the nodes of the dynamic range control frame subsequent to the reference dynamic range control frame.*

*32. The audio encoder device according to claim 27, wherein the time information of the one or more nodes is represented in such way that the one or more shifted nodes may be identified by using the time information.*

*33. The audio encoder device according to claim 32, wherein the time information of the one or more shifted nodes is represented by a sum of a time difference from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.*

*34. The audio encoder device according to claim 27, wherein the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation of the respective shifted node and a gain value of the bit representation of the node, which precedes the bit representation of the respective node.*

*35. The audio encoder device according to claim 27, wherein, in case that the bit representations of one or more shifted nodes of the reference dynamic range control frame is embedded in the bitstream portion corresponding to the dynamic range control frame subsequent to the reference dynamic range control frame, the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.*

*36. The audio encoder device according to claim 27, wherein a temporal size of the audio frames is equal to a temporal size of the dynamic range control frames.*

*37. The audio encoder device according to claim 27, wherein the one or more nodes of one of the dynamic range control frame are selected from a uniform time grid.*

*38. The audio encoder device according to claim 27, wherein each node of the one or more nodes comprises slope information.*

*39. The audio encoder device according to claim 27, wherein the dynamic range control encoder is configured for encoding the nodes using an entropy encoding technique.*

*40. An audio decoder device comprising:*

*an audio decoder configured for decoding an encoded audio bitstream in order to reproduce an audio signal comprising consecutive audio frames;*

*a dynamic range control decoder configured for decoding an encoded dynamic range control bitstream in order to reproduce a dynamic range control sequence corresponding to the audio signal and comprising consecutive dynamic range control frames;*

*wherein the encoded dynamic range control bitstream comprises for each dynamic range control frame of the dynamic range control frames a corresponding bitstream portion;*

*wherein the encoded dynamic range control bitstream comprises bit representations of nodes, wherein each bit representation of one node of the nodes comprises gain information for the audio signal and time information indicating to which point in time the gain information corresponds;*

*wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame; and*

*wherein the dynamic range control decoder is configured for decoding the bit representation of each shifted node of the shifted nodes selected from the nodes of the one reference dynamic range control frame of the dynamic range control frames in order to reproduce each shifted node of the shifted nodes selected from the nodes of the one reference dynamic range control frame of the dynamic range control frames.*

*41. The audio decoder device according to claim 40, wherein the bit representation of each remaining node of the nodes of the one reference dynamic range control frame of the dynamic range control frames is embedded into the bitstream portion corresponding to the one reference dynamic range control frame,*

*wherein the dynamic range control decoder is configured for decoding the bit representation of each remaining node of the remaining nodes of the one reference dynamic range control frame of the dynamic range control frames in order to reproduce each remaining node of the one reference dynamic range control frame*

*of the dynamic range control frames and for combining the reproduced remaining nodes and the reproduced shifted nodes in order to reconstruct the reference dynamic range control frame.*

*42. The audio decoder device according to claim 40, wherein the dynamic range control decoder is configured for identifying the one or more shifted nodes by using the time information.*

*43. The audio decoder device according to claim 40, wherein the dynamic range control decoder is configured for decoding the time information of the one or more shifted nodes, which is represented by a sum of a time difference from a beginning of the dynamic range control frame to which the respective node belongs to the temporal position of the respective node within the dynamic range control frame to which the respective node belongs and an offset value being greater than or equal to a temporal size of the dynamic range control frame subsequent to the respective dynamic range control frame.*

*44. The audio decoder device according to claim 40, wherein the dynamic range control decoder is configured for decoding the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation $B'_2$ of the respective shifted node $B_2$ and a gain value of the bit representation of the node, which precedes the bit representation of the respective node.*

*45. The audio decoder device according to claim 40, wherein the dynamic range control decoder is configured for decoding the gain information of the bit representation of the node of the subsequent dynamic range control frame at a first position of the bitstream portion corresponding to the dynamic range control frame subsequent to the reference dynamic range control frame after the one or more positions of the bit representations of the one or more shifted nodes is represented by a relative gain value which is equal to a difference of a gain value of the bit representation of the respective node and a gain value of the bit representation of the shifted node, which precedes the bit representation of the respective node.*

*46. The audio decoder device according to claim 40, wherein a temporal size of the audio frames is equal to a temporal size of the dynamic range control frames.*

*47. The audio decoder device according to claim 40, wherein the one or more nodes of one of the dynamic range control frames are selected from a uniform time grid.*

*48. The audio decoder device according to claim 40, wherein each node of the one or more nodes comprises slope information.*

*49. The audio decoder device according to claim 40, wherein the dynamic range control decoder is configured for decoding the bit representations of the nodes using an entropy decoding technique.*

*50. A system comprising an audio encoder device comprising:*

*an audio encoder configured for producing an encoded audio bitstream from an audio signal comprising consecutive audio frames;*

*a dynamic range control encoder configured for producing an encoded dynamic range control bitstream from a dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;*

*wherein the dynamic range control encoder is configured in such way that the encoded dynamic range control bitstream comprises for each dynamic range control frame of the dynamic range control frames a corresponding bitstream portion;*

*wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame,*

*and an audio decoder device according to claim 40.*

*51. A method for operating an audio encoder, the method comprising:*

*producing an encoded audio bitstream from an audio signal comprising consecutive audio frames;*

*producing an encoded dynamic range control bitstream from a dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;*

*wherein the encoded dynamic range control bitstream comprises for each dynamic range control frame of the dynamic range control frames a corresponding bitstream portion;*

*executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame.*

*52. A method for operating an audio decoder, the method comprising:*

*decoding an encoded audio bitstream in order to reproduce an audio signal comprising consecutive audio frames;*

*decoding an encoded dynamic range control bitstream in order to reproduce a dynamic range control sequence corresponding to the audio signal and comprising consecutive dynamic range control frames;*

*wherein the encoded dynamic range control bitstream comprises for each dynamic range control frame of the dynamic range control frames a corresponding bitstream portion;*

*wherein the encoded dynamic range control bitstream comprises bit representations of nodes, wherein each bit representation of one node of the nodes comprises gain information for the audio signal and time information indicating to which point in time the gain information corresponds;*

*wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame,*

*wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames.*

*53. A non-transitory digital storage medium having a computer program stored thereon to perform the method for operating an audio encoder, the method comprising:*

*producing an encoded audio bitstream from an audio signal comprising consecutive audio frames;*

*producing an encoded dynamic range control bitstream from a dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;*

*wherein the encoded dynamic range control bitstream comprises for each dynamic range control frame of the dynamic range control frames a corresponding bitstream portion;*

*executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame,*

*when said computer program is run by a computer.*

*54. A non-transitory digital storage medium having a computer program stored thereon to perform the method for operating an audio decoder, the method comprising:*

*decoding an encoded audio bitstream in order to reproduce an audio signal comprising consecutive audio frames;*

*decoding an encoded dynamic range control bitstream in order to reproduce a dynamic range control sequence corresponding to the audio signal and comprising consecutive dynamic range control frames;*

*wherein the encoded dynamic range control bitstream comprises for each dynamic range control frame of the dynamic range control frames a corresponding bitstream portion;*

*wherein the encoded dynamic range control bitstream comprises bit representations of nodes, wherein each bit representation of one node of the nodes comprises gain information for the audio signal and time information indicating to which point in time the gain information corresponds;*

*wherein the encoded dynamic range control bit stream comprises bit representations of shifted nodes selected from the nodes of one reference dynamic range control frame of the dynamic range control frames, which are embedded in a bitstream portion corresponding to the dynamic range control frame subsequent to the one reference dynamic range control frame,*

*wherein the bit representation of each shifted node of the shifted nodes selected from the nodes of the one reference dynamic range control frame of the dynamic range control frames is decoded in order to reproduce each shifted node of the shifted nodes selected from the nodes of the one reference dynamic range control frame of the dynamic range control frames;*

*when said computer program is run by a computer.*

55. An audio encoder device comprising:

an audio encoder configured for producing an encoded audio bitstream from an audio signal comprising consecutive audio frames;

a dynamic range control encoder configured for producing an encoded dynamic range control bitstream from a dynamic range control sequence corresponding to the audio signal and comprising consecutive dynamic range control frames, wherein each dynamic range control frame of the dynamic range control frames comprises one or more nodes, wherein each node of the one or more nodes comprises gain information for the audio signal and time information indicating to which point in time the gain information corresponds;

wherein the dynamic range control encoder is configured in such way that the encoded dynamic range control bitstream comprises for each dynamic range control frame of the dynamic range control frames a corresponding bitstream portion;

wherein the dynamic range control encoder is configured for executing a shift procedure, wherein one or more nodes of the nodes of one reference dynamic range control frame of the dynamic range control frames are selected as shifted nodes, wherein a bit representation of each of the one or more shifted nodes of the one reference dynamic range control frame is embedded in the bitstream portion corresponding to the dynamic range control frame subsequent to the one reference dynamic range control frame, wherein a bit representation of each remaining node of the nodes of the one reference dynamic range control frame of the dynamic range control frames is embedded into the bitstream portion corresponding to the one reference dynamic range control frame;

wherein the time information of the one or more nodes is represented in such way that the one or more shifted nodes may be identified by using the time information; and wherein the gain information of the bit representation of the shifted node, which is at a first position of the bitstream portion corresponding to the dynamic range control frame subsequent to the reference dynamic range control frame, is represented by an absolute gain value and wherein the gain information of each bit representation of the shifted nodes at a position after the bit representation of the node, which is at the first position of the bitstream portion corresponding to the dynamic range control frame subsequent to the reference dynamic range control frame, is represented by a relative gain value which is equal to a difference of a gain value of the bit representation of the respective shifted node and a gain value of the bit representation of the node, which precedes the bit representation of the respective node.

* * * * *